US009914902B2

(12) United States Patent
Du et al.

(10) Patent No.: US 9,914,902 B2
(45) Date of Patent: Mar. 13, 2018

(54) STRIPPING COMPOSITIONS FOR REMOVING PHOTORESISTS FROM SEMICONDUCTOR SUBSTRATES

(71) Applicant: Fujifilm Electronic Materials U.S.A., Inc., North Kingstown, RI (US)

(72) Inventors: Bing Du, Gilbert, AZ (US); Thomas Dory, Gilbert, AZ (US); William A. Wojtczak, Austin, TX (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 80 days.

(21) Appl. No.: 14/979,787

(22) Filed: Dec. 28, 2015

(65) Prior Publication Data

US 2016/0186106 A1  Jun. 30, 2016

Related U.S. Application Data

(60) Provisional application No. 62/097,747, filed on Dec. 30, 2014.

(51) Int. Cl.

| *C11D 7/50* | (2006.01) |
| *C11D 11/00* | (2006.01) |
| *C11D 7/32* | (2006.01) |
| *C11D 3/43* | (2006.01) |
| *C11D 3/30* | (2006.01) |
| *H01L 21/311* | (2006.01) |
| *C11D 3/00* | (2006.01) |
| *C11D 3/20* | (2006.01) |
| *C11D 3/28* | (2006.01) |
| *C11D 7/26* | (2006.01) |
| *G03F 7/42* | (2006.01) |

(52) U.S. Cl.
CPC ........ *C11D 11/0047* (2013.01); *C11D 3/0026* (2013.01); *C11D 3/2006* (2013.01); *C11D 3/28* (2013.01); *C11D 3/30* (2013.01); *C11D 3/43* (2013.01); *C11D 7/261* (2013.01); *C11D 7/3209* (2013.01); *C11D 7/3281* (2013.01); *C11D 7/5009* (2013.01); *C11D 7/5013* (2013.01); *C11D 7/5022* (2013.01); *G03F 7/423* (2013.01); *G03F 7/425* (2013.01); *G03F 7/426* (2013.01); *H01L 21/31133* (2013.01)

(58) Field of Classification Search
CPC .................................................. C11D 11/0047
USPC ......................................................... 510/175
See application file for complete search history.

(56) References Cited

U.S. PATENT DOCUMENTS

| 5,139,607 | A | 8/1992 | Ward et al. | |
| 2005/0153059 | A1 | 7/2005 | Wakizaka | |
| 2005/0197265 | A1* | 9/2005 | Rath | C11D 3/044 |
| | | | | 510/175 |
| 2005/0287480 | A1 | 12/2005 | Takashima | |
| 2006/0063687 | A1 | 3/2006 | Minsek et al. | |
| 2009/0215659 | A1* | 8/2009 | Minsek | G03F 7/425 |
| | | | | 510/176 |
| 2010/0152086 | A1* | 6/2010 | Wu | C11D 3/0073 |
| | | | | 510/175 |
| 2010/0261632 | A1* | 10/2010 | Korzenski | C11D 7/265 |
| | | | | 510/175 |
| 2011/0275164 | A1* | 11/2011 | Visintin | H01L 21/02079 |
| | | | | 438/4 |
| 2012/0042898 | A1 | 2/2012 | Visintin et al. | |
| 2013/0334679 | A1 | 12/2013 | Atkinson et al. | |
| 2015/0307818 | A1* | 10/2015 | Barnes | H01L 21/02063 |
| | | | | 510/175 |
| 2016/0075971 | A1* | 3/2016 | Liu | C23G 1/18 |
| | | | | 510/175 |
| 2016/0185595 | A1* | 6/2016 | Chen | H01L 21/02063 |
| | | | | 216/13 |

FOREIGN PATENT DOCUMENTS

WO  WO 2010/091045  8/2010  .............. G03F 7/42

OTHER PUBLICATIONS

International Search Report and Written Opinion of the International Searching Authority for International Application No. PCT/US2015/067592 dated Mar. 28, 2016 (8 pages).

* cited by examiner

*Primary Examiner* — Gregory Webb
(74) *Attorney, Agent, or Firm* — Fish & Richardson P.C.

(57) ABSTRACT

This disclosure relates to photoresist stripping compositions containing 1) at least one water soluble polar aprotic organic solvent; 2) at least one alcohol solvent; 3) at least one quaternary ammonium hydroxide; 4) water; 5) at least one copper corrosion inhibitor selected from 6-substituted-2,4-diamino-1,3,5-triazines; and 6) optionally, at least one defoaming surfactant.

27 Claims, No Drawings

STRIPPING COMPOSITIONS FOR REMOVING PHOTORESISTS FROM SEMICONDUCTOR SUBSTRATES

CROSS-REFERENCE TO RELATED APPLICATION

The present application claims priority to U.S. Provisional Application Ser. No. 62/097,747, filed on Dec. 30, 2014, the contents of which are hereby incorporated by reference in its entirety.

BACKGROUND

1. Field of the Disclosure

The present disclosure relates generally to novel stripping compositions for removal of photoresists (e.g., positive or negative photoresists) or photoresist residues from semiconductor substrates. Specifically, the present disclosure relates to alkaline compositions useful for removing photoresists or photoresist residues after an etching or plasma ashing process.

2. Discussion of the Background Art

In the manufacture of integrated circuits, a flip chip process known as Controlled Collapse Chip Connection (C4) process for interconnecting semiconductor devices, such as IC chips and microelectromechanical systems (MEMS) to external circuitry with solder bumps that have been deposited onto the chip pads, has now become quite well established. Thick negative-tone photoresist is commonly applied during flip chip or C4 processes and commercially available resist stripping formulations for thick negative-tone resist are predominantly DMSO (dimethylsulfoxide) or NMP (N-methylpyrrolidone) plus TMAH (tetramethylammonium hydroxide) based formulations. However, those commercially available resist stripping formulations for thick negative-tone resist may exhibit the problems of insufficient resist stripping capability, short bath life, or poor compatibility with metal substrates and bump compositions. In addition, foaming issues produced by the dissolved photoresist or the surfactants in the dissolved photoresist can occur.

SUMMARY OF THE DISCLOSURE

This disclosure describes the development of resist stripping compositions tailored for devices containing bumps and metallization materials (such as SnAg, CuNiSn, CuCoCu, CoSn, Ni, Cu, Al, W, Sn, Co, and the like). The inventors discovered unexpectedly that the ability to effectively strip thick positive or negative-tone resist and be non-corrosive to bumps and underlying metallization materials (such as SnAg, CuNiSn, CuCoCu, CoSn, Ni, Cu, Al, W, Sn, Co, and the like) can be achieved by using the compositions of the present disclosure. In addition, the compositions of this disclosure exhibit broad material compatibility and can effectively control the foaming issues during the stripping process.

In some embodiments, this disclosure features a photoresist stripping composition that includes a) at least one water soluble polar aprotic organic solvent; b) at least one alcohol solvent; c) at least one quaternary ammonium hydroxide; d) water; e) at least one copper corrosion inhibitor selected from 6-substituted-2,4-diamino-1,3,5-triazines; and f) optionally, at least one defoaming surfactant. In some embodiments, the photoresist stripping composition can further include at least one aluminum corrosion inhibitor.

In some embodiments, the disclosure concerns an alkaline photoresist stripping composition containing
a) about 30% to about 90% of at least one water soluble polar aprotic organic solvent;
b) about 5% to about 60% of at least one alcohol solvent;
c) about 0.1% to about 10% of at least one quaternary ammonium hydroxide;
d) about 2.5% to about 25% of water;
e) about 0.1% to about 10% of at least one copper corrosion inhibitor selected from 6-substituted-2,4-diamino-1,3,5-triazines;
f) optionally about 0.1% to about 10% of at least one Al corrosion inhibitor selected from the group consisting of phosphoric acids, salts of phosphoric acids, 1,2,3-triazole carboxylic acid compounds substituted with a group that under basic conditions is an electron donating group, and 1,2,4-triazole carboxylic acid compounds substituted with a group that under basic conditions is an electron donating group, with a proviso that the triazole carboxylic acid compounds contain one NH moiety in the 1,2,3- or 1,2,4-triazole ring;
g) and, optionally, about 0.01% to about 3% of at least one defoaming surfactant.

In some embodiments, this disclosure concerns an alkaline photoresist stripping composition containing
a) about 30% to about 90% of at least one water soluble polar aprotic organic solvent;
b) about 5% to about 60% of at least one alcohol solvent;
c) about 0.1% to about 10% of at least one quaternary ammonium hydroxide;
d) about 2.5% to about 25% of water;
e) about 0.1% to about 10% of at least one copper corrosion inhibitor selected from 6-substituted-2,4-diamino-1,3,5-triazines; and optionally,
f) about 0.01% to about 3% of at least one defoaming surfactant.

In some embodiments, this disclosure concerns a photoresist stripping method that includes contacting a semiconductor substrate containing a photoresist or a photoresist residue with a photoresist stripping composition of this disclosure to remove the photoresist or photoresist residue. In some embodiments, the stripping method further includes forming a semiconductor device (e.g., an integrated circuit device such as a semiconductor chip) from the semiconductor substrate obtained by the method described above.

In some embodiments, the photoresist stripping compositions described above can have a pH of at least about 13.

DETAILED DESCRIPTION OF THE DISCLOSURE

Definitions

As defined herein, unless otherwise noted, all percentages expressed should be understood to be percentages by weight to the total weight of the stripping composition. Unless otherwise noted, ambient temperature is defined to be between about 16 and about 27 degrees Celsius (° C.).

As defined herein, a "water-soluble" substance (e.g., a water-soluble alcohol, ketone, ester, ether, and the like) refers to a substance having a solubility of at least 5% by weight in water at 25° C.

As used herein, the term "polar aprotic solvent" refers to a solvent that lacks an acidic proton and has a relatively high dipole moment (e.g., at least 2.7).

As defined herein, a "Group II metal cation" refers to a cation of a metal in Group II of the Periodic Table.

Tautomerization is herein defined as the formal migration of a hydrogen atom or proton accompanied by a switch of a single and an adjacent double bond. The mention, description, or claim of triazole compounds also includes the tautomers of the triazole compounds due to the low activation energy for tautomerization in the triazole ring system.

As defined herein, the term "triazole" does not include annelated triazoles such as benzotriazole or naphthotriazole or their derivatives. Although the triazoles of this disclosure may have cyclic substituents, the substituents are attached to the ring at only one carbon.

In some embodiments, this disclosure concerns an alkaline photoresist stripping composition containing
  a) about 30% to about 90% of at least one water soluble polar aprotic organic solvent;
  b) about 5% to about 60% of at least one alcohol solvent;
  c) about 0.1% to about 10% of at least one quaternary ammonium hydroxide;
  d) about 2.5% to about 25% of water;
  e) about 0.1% to about 10% of at least one copper corrosion inhibitor selected from 6-substituted-2,4-diamino-1,3,5-triazines; and, optionally,
  f) about 0.01% to about 3% of at least one defoaming surfactant.

The stripping compositions of this disclosure contain at least one water soluble polar aprotic solvent. The water soluble polar aprotic solvent may be one water soluble solvent or a mixture of water soluble solvents in any ratio. Examples of such solvents suitable for use in the present disclosure include, but are not limited to, dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone and mixtures thereof. In some embodiments, the water soluble polar aprotic solvent is dimethylsulfoxide, sulfolane, gamma-butyrolactone, or N-methylpyrrolidone.

In some embodiments, the compositions of this disclosure contain at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent.

The stripping compositions of this disclosure contain at least one alcohol solvent, such as a water soluble alcohol solvent. Classes of water soluble alcohol solvents include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, alcohols (e.g., low molecular weight alcohols) containing a ring structure, and mixtures thereof. The stripping compositions can include one alcohol solvent or a mixture of alcohol solvents in any ratio.

Examples of water soluble alkane diols include, but are not limited to, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, hexylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to allyl alcohol, propargyl alcohol, 2-butenyl alcohol, 3-butenyl alcohol, and 4-penten-2-ol.

Examples of water soluble, low molecular weight alcohols containing a ring structure include, but are not limited to, tetrahydrofurfuryl alcohol, furfuryl alcohol, and 1,3-cyclopentanediol.

In some embodiments, the water soluble alcohol solvents are, alkoxyalcohols, tetrahydrofurfuryl alcohol, and water soluble alkanediols. In some embodiments, the water soluble alcohol solvents are 3-methoxy-3-methyl-1-butanol, 3-methoxy-1-butanol, 1-methoxy-2-butanol, water soluble glycol monoethers, water soluble alkylenene glycols, and tetrahydrofurfuryl alcohol. In some embodiments, the water soluble alcohol solvents are 3-methoxy-3-methyl-1-butanol, diethylene glycol monomethyl ether, diethylene glycol monoethyl ether, ethylene glycol mono n-butyl ether, propylene glycol, hexylene glycol, and tetrahydrofurfuryl alcohol.

In some embodiments, when the photoresist stripping method described herein employs a heated stripper, the water soluble alcohols can have a boiling point above 110° C. for safety considerations.

In some embodiments, the stripping compositions of this disclosure contain at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one alcohol solvent.

The stripping compositions of this disclosure contain at least one quaternary ammonium hydroxide. In some embodiments, the preferred quaternary ammonium hydroxide is a compound represented by the general formula $[NR_1R_2R_3R_4]^+OH$, where $R_1$, $R_2$, $R_3$, and $R_4$ are independently a linear, branched or cyclic alkyl group optionally substituted by hydroxy, a substituted or unsubstituted phenyl group, or a substituted or unsubstituted benzyl group (e.g., a benzyl group substituted or unsubstituted on its phenyl group). Substituents on the phenyl group and on the phenyl group of the benzyl group may include halogen, hydroxyl, alkoxy, or alkyl. In some embodiments, the quaternary ammonium hydroxide is a tetralkylammonium hydroxide. In some embodiments, the quaternary ammonium hydroxide is a tetralkanol ammonium hydroxide. In some embodiments, the quaternary ammonium hydroxide is a mixture of two or more quaternary ammonium hydroxides in any ratio.

In some embodiments, the preferred quaternary ammonium hydroxide is a compound of the general formula $[NR_1R_2R_3R_4]^+OH$ where $R_1$, $R_2$, $R_3$, and $R_4$ are independently a $C_1$-$C_4$ alkyl group, a hydroxyethyl group, a phenyl group, or a benzyl group.

Examples of suitable quaternary ammonium hydroxide compounds include, but are not limited to, tetramethylammonium hydroxide (TMAH), tetraethylammonium hydroxide (TEAH), tetrapropylammonium hydroxide, tetrabutylammonium hydroxide (TBAH), ethyltrimethylammonium hydroxide, diethyldimethylammonium hydroxide, methyltripropylammonium hydroxide, butyltrimethylammonium hydroxide, methyltributylammonium hydroxide, pentyltrimethylammonium hydroxide, (2-hydroxyethyl)trimethylammonium hydroxide (choline), (2-hydroxyethyl)triethylammonium hydroxide, (2-hydroxyethyl)triethylammonium hydroxide, (3-hydroxypropyll)triethylammonium hydroxide, tris-2-hydroxyethylammonium hydroxide, tetraethanolammonium hydroxide, phenyltrimethylammonium hydroxide, benzyltrimethylammonium hydroxide and mixtures thereof.

In some embodiments, the quaternary ammonium hydroxide is tetramethylammounium hydroxide, (2-hydroxyethyl) trimethylammonium hydroxide (choline), benzyltrimethylammonium hydroxide, tetrabutylammonium hydroxide, or tetraethanolammonium hydroxide.

In some embodiments, the quaternary ammonium hydroxide is TMAH, TEAH, TBAH, choline, or tetraethanolammonium hydroxide.

In some embodiments, the compositions of this disclosure contain at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide.

The stripping compositions of the present disclosure generally contain water. In some embodiments, the water is de-ionized and ultra-pure, contains no organic contaminants and has a minimum resistivity of about 4 to about 17 mega Ohms. In some embodiments, the resistivity of the water is at least 17 mega Ohms.

In some embodiments, the stripping compositions of this disclosure contain at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water.

The stripping compositions of the present disclosure can further include at least one copper corrosion inhibitor which is a 6-substituted-2,4-diamino-1,3,5-triazine. The substituent on the 2,4-diamino-1,3,5-triazine may be a linear or branched substituted or unsubstituted $C_1$-$C_{12}$ alkyl group (e.g., methyl, hexyl, —$CH_2$-aryl, $CH_2OR^{100}$, —$CH_2SR^{100}$, —$CH_2(NR^{100}R^{101})$) a substituted or unsubstituted $C_3$-$C_{12}$ cycloalkyl group (e.g., cyclohexyl, methylcyclohexyl, or hydroxycyclohexyl), a substituted or unsubstituted aryl group (e.g., phenyl, methoxyphenyl, or naphthyl), —$SCH_2R^{100}$, —$N(R^{100}R^{101})$ or imidyl, where each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring. Substituents on the alkyl and cycloalkyl groups may further include, $C_1$-$C_4$ alkyl, $C_1$-$C_4$ alkoxy, hydroxyl, and substituted or unsubstituted aryl. In some embodiments, substituents on the aryl groups are electron donating (e.g., alkoxy) rather than electron withdrawing (e.g., halogen).

Examples of suitable 6-substituted-2,4-diamino-1,3,5-triazines include 6-methyl-2,4-diamino-1,3,5-triazine; 6-phenyl-2,4-diamino-1,3,5-dimethyltriazine; 1,3,5-triazine-2,4-diamine, 6-[2-(2-furanyl)ethyl]-; 1,3,5-triazine-2,4-diamine, 6-[(hexahydro-1-methylpyrrolo[3,4-c]pyrrol-2(1H)-yl) methyl]-; 1,3,5-triazine-2,4-diamine, 6-[[(3-aminobutyl) thio]methyl]-; 1,3,5-triazine-2,4-diamine, 6-(4,4-difluorocyclohexyl)-; 1,3,5-triazine-2,4-diamine, 6-[(3-chlorophenyl) methyl]-; 1,3,5-triazine-2,4-diamine, 6-[(phenylthio) methyl]-; 1,3,5-triazine-2,4-diamine, 6-[(tetrahydro-2H-pyran-2-yl)methyl]-; 2-(4,6-diamino-1,3,5-triazin-2-yl)-4-fluoro-phenol; 1,3,5-triazine-2,4-diamine, 6-(1-ethylcyclopentyl)-; 1,3,5-triazine-2,4-diamine, 6-[[4-(diphenylmethyl)-1-piperazinyl]methyl]-; 9-acridinecarboxylic acid, 1,2,3,4-tetrahydro-4-[(4-methoxyphenyl)methylene]-, (4,6-diamino-1,3,5-triazin-2-yl)methyl ester; 1H-Benz[de]isoquinoline-1,3(2H)-dione, 2-[[(4,6-diamino-1,3,5-triazin-2-yl)amino]methyl]-; 9-acridinecarboxylic acid, 2-(1,1-dimethylpropyl)-1,2,3,4-tetrahydro-,(4,6-diamino-1,3,5-triazin-2-yl)methyl ester; 1,3,5-triazine-2,4,6-triamine, N2-[2-[(7-chloro-4-quinolinyl) amino]ethyl]-; 1,3,5-triazine-2,4-diamine, 6-[[4-(1-methylethyl)phenoxy]methyl]-; 1,3,5-triazine-2,4-diamine, 6-[[3-(trifluoromethyl)phenoxy]methyl]-; 1,3,5-triazine-2,4-diamine, 6-[[(tetrahydro-2H-pyran-2-yl)methyl]thio]-; N-cyclohexyl-2-[(4,6-diamino-1,3,5-triazin-2-yl)thio]-propanamide; 3-chloro-4-[(4,6-diamino-1,3,5-triazin-2-yl) methoxy]-5-methoxy-benzonitrile; benzeneacetic acid, 3-methoxy-, (4,6-diamino-1,3,5-triazin-2-yl)methyl ester; 1,3,5-triazine-2,4-diamine, 6-[3-(1-pyrrolidinyl)phenyl]-; 1,3,5-triazine-2-octanenitrile, 4,6-diamino-; s-triazine-2-butyronitrile, 4,6-diamino-; 1,3,5-triazine-2-propanoic acid, 4,6-diamino-; 1,3,5-triazine-2-methanethiol, 4,6-diamino-; benzamide, N-(4,6-diamino-1,3,5-triazin-2-yl)-4-hydroxy-; and 1,3,5-triazine-2,4-diamine, 6-[(methylthio)methyl]-.

In some embodiments, the stripping compositions of this disclosure contain at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor.

The stripping compositions of the present disclosure optionally include an defoaming surfactant. Examples of suitable defoaming surfactants include polysiloxanes (e.g., polydimethylsiloxane), polyethylene glycol methyl ether polymers, ethylene oxide/propylene oxide copolymers, tetramethyldecynediol, and glycidyl ether capped acetylenic diol ethoxylates (as described in U.S. Pat. No. 6,717,019, herein incorporated by reference). Examples of commercial defoaming surfactants include Surfynol 440, Surfynol 104, Surfynol MD-20, Troysol S366, Coastal 1017F, Aldo LF, Dow DB-100, and Dow DSP. In some embodiments, defoaming surfactants are Surfynol MD-20, Surfynol 104, and Troysol S366.

In some embodiments, the stripping compositions of this disclosure contain at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant.

In addition, in some embodiments, the stripping compositions of the present disclosure may contain additives such as, additional pH adjusting agents (such as organic acids, inorganic acids, and organic bases), additional corrosion inhibitors, chelating agents, surfactants, additional organic solvents (e.g. glycol diethers), and biocides, as optional components.

In some embodiments, the stripping compositions of the present disclosure may specifically exclude one or more of the following components, in any combination, if more than one. Such components are selected from the group consisting of oxygen scavengers, amidoximes, oxidizing agents (e.g., peroxides, oxoammonium compounds, inorganic oxidizing agents, and peracids), abrasives, fluoride containing compounds, alkali metal and alkaline earth bases (such as NaOH, KOH, magnesium hydroxide, calcium hydroxide and LiOH), metal halide compounds, carboxylic acids, phosphinic acids, tetrahydrofurfuryl alcohol, glycols, furanyl alcohol, glycerine, sugar alcohols, saccharides, aryl ethers, N-hydroxy formamide, alkanolamines, N-alkylalkanolamines, sulfonated polymers, metal sulfonates, hydroxylamine, 2-aminobenzothiazole, thiobenzotriazole, sulfonated polyesters, urea compounds, silicate bases, silanes, silicon compounds, surfactants other than a defoaming surfactant, pyrolidone, steric hindered amide solvents such as 1,3-dimethyl-2-piperidone and 1,5-dimethyl-2-piperidone, sulfur compounds other than DMSO or dimethylsulfone or triazole compounds containing sulfur containing substituents, tetrazolium salts, boric acid and derivatives of boric acid, benzimidazoles, non-triazole containing phenolic compounds, chelating agents, and corrosion inhibitors other than the Cu or Al corrosion inhibitors described in this disclosure.

In some embodiments of this disclosure, the stripping compositions of the present disclosure optionally further include at least one Al corrosion inhibitor. In these embodiments, the alkaline photoresist stripping composition may contain a) about 30% to about 90% of at least one water soluble polar aprotic organic solvent;

b) about 5% to about 60% of at least one alcohol solvent;

c) about 0.1% to about 10% of at least one quaternary ammonium hydroxide;

d) about 2.5% to about 25% of water;

e) about 0.1% to about 10% of at least one copper corrosion inhibitor selected from 6-substituted-2,4-diamino-1,3,5-triazines;

f) about 0.1% to about 10% of at least one Al corrosion inhibitor selected from phosphoric acids, salts of phosphoric acids, 1,2,3-triazole carboxylic acid compounds substituted with a group that under basic conditions is an electron donating group, and 1,2,4-triazole carboxylic acid compounds substituted with a group that under basic conditions is an electron donating group, with a proviso that the triazole carboxylic acid compounds contain one NH moiety in the 1,2,3- or 1,2,4-triazole ring, and optionally, g) about 0.01% to about 3% of at least one defoaming surfactant.

The elements a-e and g of these embodiments of the disclosure are described above.

Some embodiments of this disclosure contain at least one Al corrosion inhibitor selected from phosphoric acids, salts of phosphoric acids, 1,2,3-triazole carboxylic acid compounds substituted with a group that under basic conditions is an electron donating group, and 1,2,4-triazole carboxylic acid compounds substituted with a group that under basic conditions is an electron donating group, with a proviso that the triazole carboxylic acid compounds contain one NH moiety in the 1,2,3- or 1,2,4-triazole ring.

Phosphoric acids contemplated in this disclosure include monophosphoric acid, polyphosphoric acids, and phosphoric anhydride. Examples of polyphosphoric acids include, but are not limited to, pyrophosphoric acid, tripolyphosphoric acid, tetrapolyphosphoric acid, and trimetaphosphoric acid. The polyphosphoric acids and phosphoric anhydride are known to hydrolyze to monophosphoric acid and so are sources of monophosphoric acid.

In some embodiments, the salts of phosphoric acids are selected from the reaction products of the phosphoric acids with ammonium hydroxide, organic bases (such as the quaternary ammonium hydroxides of the general formula $[NR_1R_2R_3R_4]^+OH$ where $R_1$, $R_2$, $R_3$, and $R_4$ defined above), amidine bases (such as guanidine, acetamidine, formamidine, diazabicycloundecene (DBU) and diazabicyclononene (DBN)), and amines (such as primary, secondary, and tertiary monoamines; primary, secondary, and tertiary diamines; and primary, secondary, and tertiary alkanolamines) in the presence of water. The salts may be prepared before formulation of the stripping composition or in situ during formulation of the stripping composition.

Examples of suitable quaternary ammonium hydroxide compounds that can be used to form phosphoric acid salts include, but are not limited to, tetramethylammonium hydroxide (TMAH), tetraethylammonium hydroxide (TEAH), tetrapropylammonium hydroxide, tetrabutylammonium hydroxide (TBAH), ethyltrimethylammonium hydroxide, diethyldimethylammonium hydroxide, methyltripropylammonium hydroxide, butyltrimethylammonium hydroxide, methyltributylammonium hydroxide, pentyltrimethylammonium hydroxide, (2-hydroxyethyl)trimethylammonium hydroxide (choline), (2-hydroxyethyl)triethylammonium hydroxide, (2-hydroxyethyl)triethylammonium hydroxide, (3-hydroxypropyll)triethylammonium hydroxide, tris-2-hydroxyethylammonium hydroxide, tetraethanolammonium hydroxide, phenyltrimethylammonium hydroxide, benzyltrimethylammonium hydroxide and mixtures thereof.

Examples of suitable primary, secondary, or tertiary monoamines that can be used to form phosphoric acid salts include, but are not limited to, methylamine, ethylamine, propylamine, butylamine, hexylamine, isopropylamine, dimethylamine, ethylmethylamine, methylpropylamine, methylisopropylamine, butylmethylamine, dimethylamine, diethylamine, dipropylamine, dibutylamine, dihexylamine, ethylpropylamine, ethylbutylamine, propylbutylamine, trimethylamine, triethylamine, tripropylamine, and tributylamine, Examples of suitable primary, secondary, or tertiary diamines that can be used to form phosphoric acid salts include, but are not limited to, ethylenediamine, propylenediamine, butylenediamine, N-methylethylenediamine, N,N-dimethylethylenediamine, N,N'-dimethylethylenediamine, N,N,N'trimethylethylenediamine, N,N,N',N',-tetramethylethylenediamine, N,N-dimethyl-N'-ethylethylenediamine, N-methyl-N'-ethylethylenediamine, N,N-dimethylbutylenediamine, and N,N'-dimethylbutylenediamine.

Examples of suitable primary, secondary, or tertiary alkanolamines that can be used to form phosphoric acid salts include, but are not limited to, hydroxyethylamine, hydroxypropylamine, hydroxybutylamine, (N-hydroxyethyl)methylamine, (N-hydroxyethyl)dimethylamine, (N,N-dihydroxyethyl)methylamine, (N-hydroxyethyl)ethylamine, (N-hydroxyethyl) diethylamine, (N,N-dihydroxyethyl)ethylamine, (N-hydroxyethyl)propylamine, (N-hydroxyethyl) dipropylamine, (N,N-dihydroxyethyl)propylamine, (N-hydroxyethyl)butylamine, (N-hydroxyethyl)dibutylamine, (N,N-dihydroxyethyl)butylamine, (N-hydroxyethyl)pentylamine, (N-hydroxyethyl)dipentylamine, (N,N-dihydroxyethyl) pentylamine, (N-hydroxyethyl)hexylamine, (N-hydroxyethyl)dihexylamine, (N,N-dihydroxyethyl) hexylamine, N-hydroxyethylheptylamine, (N,N-dihydroxyethyl) heptylamine, (N-hydroxyethyl)octylamine, (N,N-dihydroxyethyl)octylamine, N-hydroxyethylmethylethylamine, (N-hydroxyethyl)methylpropylamine, (N-hydroxyethylmethyl)butylamine, (N-hydroxyethyl)ethylpropylamine, (N-hydroxyethyl)ethylbutylamine, bis(N,N-hydroxyethyl)amine, tris(N,N,N-hydroxyethyl)|amine, (N,N-dihydroxyethyl)methylamine, (N,N-dihydroxyethyl) propylamine, (N,N-dihydroxyethyl)butylamine, (N-hydroxyethyl)aminoethoxyethanol, aliphatic alkanol polyamines such as (N-hydroxyethyl)ethylenediamine, (N,N-dihydroxyethyl)ethylenediamine, (N,N'-dihydroxyethyl)ethylenediamine, (N-hydroxyethyl)butylenediamine, (N-hydroxyethylpropylenediamine, (N,N'-dihydroxyethyl) butylenediamine, (N,N-dihydroxyethyl)butylenediamine, (N,N,N'-trihydroxyethyl)butylenediamine, (N,N,N',N'-tetrahydroxyethyl)butylenediamine, (N,N'-dihydroxyethyl)propylenediamine, (N,N-dihydroxyethyl)propylenediamine, (N,N,N'-trihydroxyethyl)propylenediamine, (N,N,N',N'-tetrahydroxyethyl)propylenediamine, (N,N,N'-trihdroxyethyl) ethylenediamine, (N,N,N',N'-tetrahydroxyethyl)ethylenediamine, N-hydroxyethyl-N-methylethylenediamine, N,N'-dihydroxyethyl-N-methyl ethylenediamine, N,N',N'-trihydroxyethyl-N-methylethylenediamine, N-hydroxyethyl-N',N'-dimethylethylenediamine, N,N-dihydroxyethyl-N',N'-dimethylethylenediamine, N-hydroxyethyl-N,N',N'-trimethylethylenediamine, N-hydroxyethyl-N-ethylethylenediamine, N,N'-dihydroxyethyl-N-ethylethylenediamine, N,N',N'-trihydroxyethyl-N-methylethylenediamine, N-hydroxyethyl-N',N'-diethylethylenediamine, N,N-dihydroxyethyl-N',N'-diethylethylenediamine, N-hydroxyethyl-N,N',N'-triethylethylenediamine, and aliphatic alkanol ether amines such as (N-hydroxyethyl)methoxyethylamine, (N,N-dihydroxyethyl)methoxyethylamine, (N-hydroxyethyl)methoxypropylamine, (N,N-dihydroxyethyl)methoxypropylamine, (N-hydroxyethyl)ethoxyethylamine, (N,N-dihydroxyethyl) ethoxyethylamine, (N-hydroxyethyl)ethoxypropylamine, and (N,N-dihydroxyethyl)ethoxypropylamine.

Some embodiments of the stripping compositions described herein can contain at least one Al corrosion inhibitor. In some embodiments, the at least one Al corrosion inhibitor can include compounds selected from the group consisting of phosphoric acids and salts of phosphoric acids. Examples of such Al corrosion inhibitors include monophosphoric acid, polyphosphoric acids, phosphoric anhydrides, and salts thereof.

In some embodiments, the at least one Al corrosion inhibitor can include first and second components. The first component can include a Group II metal cation. Examples of suitable Group II metal cations include $Ca^{2+}$, $Mg^{2+}$, $Sr^{2+}$, and $Ba^{2+}$. In some embodiments, the stripping compositions described herein can include at least about 5 ppm (e.g., at least about 7 ppm, at least about 8 ppm, or at least about 10 ppm) and/or at most about 30 ppm (e.g., at most about 25 ppm, at most about 20 ppm, or at most about 15 ppm) of the first component. Without wishing to be bound by theory, it is believed that a stripping composition containing a relatively high amount solubilized Group II metal cations (e.g., calcium cation) can significantly reduce the Al etch rate of the stripping composition, thereby allowing the stripping composition to inhibit Al etch during use. Further, without wishing to be bound by theory, it is believed that, as Group II metal compounds are generally not very soluble in the stripping compositions described herein, adding an agent that can solubilize Group II metal cations (e.g., by forming a complex with a Group II metal cation) can significantly increase the amount of the solubilized Group II metal cations in the stripping compositions, thereby improving their Al etch inhibition abilities.

In some embodiments, the second component in the at least one Al corrosion inhibitor can include an agent capable of solubilizing the Group II metal cation (e.g., by forming a complex with a Group II metal cation). In some embodiments, the agent can be selected from a 1,2,3-triazole carboxylic acid compound substituted with a group that under basic conditions is an electron donating group, and a 1,2,4-triazole carboxylic acid compound substituted with a group that under basic conditions is an electron donating group, optionally with a proviso that the triazole carboxylic acids contain one NH moiety in the 1,2,3- or 1,2,4-triazole ring.

Examples of suitable groups that under basic conditions are electron donating groups include, but are not limited to, carboxyl, mercapto, hydroxyphenyl, amino, alkylamino, and dialkylamino. While not wishing to be bound by theory, it is believed that the carboxyl group on the triazole carboxylic acid compound can form a complex with the aluminum on the substrate. In addition, the group that under basic conditions is an electron donating group may also form a complex with the aluminum on the substrate or, by virtue of being electronically connected to the carboxyl group through the triazole ring system, positively influence the binding constant with the aluminum.

Tautomerization is the formal migration of a hydrogen atom or proton accompanied by a switch of a single and an adjacent double bond. Triazoles having a NH bond generally have a low activation energy for tautomerization. Thus, the position of the NH and one of the double bonds in the ring may vary depending on temperature or solvent polarity. Thus, the mention, description, or claim of triazole compounds also includes the tautomers of the triazole compounds.

Examples of suitable triazole carboxylic acids include, but are not limited to, 3-amino-1,2,4-triazole-5-carboxylic acid; 5-amino-1,2,4-triazole-3-carboxylic acid; 5-amino-1H-1,2,3-triazole-4-carboxylic acid; 4-amino-1H-1,2,3-triazole-5-carboxylic acid; 2H-1,2,3-triazole-4,5-dicarboxylic acid; 1H-1,2,4-triazole-3,5-dicarboxylic acid; 1H-1,2,3-triazole-4,5-dicarboxylic acid; 2,5-dihydro-5-thioxo-1H-1,2,4-triazole-3-carboxylic acid; 5-mercapto-1H-1,2,3-triazole-4-carboxylic acid; 4-(4-hydroxyphenyl)-1H-1,2,3-triazole-5-carboxylic acid; 4-(2-hydroxyphenyl)-1H-1,2,3-triazole-5-carboxylic acid; 3-(4-hydroxyphenyl)-1,2,4-triazole-5-carboxylic acid; 3-(2-hydroxyphenyl)-1,2,4-triazole-5-carboxylic acid; 5-(4-hydroxyphenyl)-1,2,4-triazole-3-carboxylic acid; and 5-(2-hydroxyphenyl)-1,2,4-triazole-3-carboxylic acid.

In some embodiments, the stripping compositions of this disclosure contain at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one aluminum corrosion inhibitor.

In addition, in some embodiments, the stripping compositions of the present disclosure that include an aluminum corrosion inhibitor may contain additives such as, additional pH adjusting agents, additional corrosion inhibitors, surfactants, additional organic solvents (e.g. glycol diethers), and biocides, as optional components.

In embodiments containing the Al corrosion inhibitor, the stripping compositions of the present disclosure may specifically exclude one or more of the following components, in any combination, if more than one. Such components are selected from the group consisting of oxygen scavengers, amidoximes, oxidizing agents (e.g., peroxides, oxoammonium compounds, inorganic oxidizing agents, and peracids), abrasives, fluoride containing compounds, alkali metal and alkaline earth bases (such as NaOH, KOH, magnesium hydroxide, calcium hydroxide and LiOH), metal halide compounds, carboxylic acids, phosphinic acids, tetrahydrofurfuryl alcohol, glycols, furanyl alcohol, glycerine, sugar alcohols, saccharides, aryl ethers, N-hydroxy formamide, alkanolamines, N-alkylalkanolamines, sulfonated polymers, metal sulfonates, hydroxylamine, 2-aminobenzothiazole, thiobenzotriazole, sulfonated polyesters, urea compounds, silicate bases, silanes, silicon compounds, surfactants other than a defoaming surfactant, pyrolidone, steric hindered amide solvents such as 1,3-dimethyl-2-piperidone and 1,5-dimethyl-2-piperidone, sulfur compounds other than DMSO or dimethylsulfone or triazole compounds containing sulfur containing substituents, tetrazolium salts, boric acid and derivatives of boric acid, benzimidazoles, non-triazole containing phenolic compounds, and corrosion inhibitors other than of the Cu or Al corrosion inhibitors described in this disclosure.

In some embodiments, the stripping compositions of this disclosure contain, consist, or consist essentially of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent; at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one alcohol solvent; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide; at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted 2,4-diamino-1,3,5-triazines; and optionally, at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant.

In some embodiments, the stripping compositions of this disclosure contain, consist, or consist essentially of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent selected from dimethylsulfoxide, sulfolane, gamma-butyrolactone, and N-methylpyrrolidone; at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one water soluble alcohol solvent selected from glycols, alkoxyalcohols, and tetrahydrofurfuryl alcohol; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide selected from quaternary ammonium hydroxide compounds of the general formula $[NR_1R_2R_3R_4]^+OH$, where $R_1$, $R_2$, $R_3$, and $R_4$ are independently a $C_1$-$C_4$ alkyl group, a hydroxyethyl group, a phenyl group, or a benzyl group; at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted-2,4-diamino-1,3,5-triazines wherein the 6-substituent is selected from a $C_1$-$C_4$ alkyl group and a substituted or unsubstituted aryl group; and optionally, at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant.

In some embodiments, the stripping compositions of this disclosure contain, consist, or consist essentially of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent; at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one alcohol solvent; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide; at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted-2,4-diamine-1,3,5-triazines; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one aluminum corrosion inhibitor selected from phosphoric acids, salts of phosphoric acids, 1,2,3-triazole carboxylic acid compounds substituted with a group that under basic conditions is an electron donating group, and 1,2,4-triazole carboxylic acid compounds substituted with a group that under basic conditions is an electron donating group, with the proviso that the triazole carboxylic acid compounds contain one NH moiety in the 1,2,3- or 1,2,4-triazole ring, and optionally, at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant.

In some embodiments, the stripping compositions of this disclosure contain, consist, or consist essentially of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent selected from dimethylsulfoxide, sulfolane, gamma-butyrolactone, and N-methylpyrrolidone; at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one water soluble alcohol solvent selected from glycols, alkoxyalcohols, and tetrahydrofurfuryl alcohol; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide selected from quaternary ammonium hydroxide compounds of the general formula $[NR_1R_2R_3R_4]^+OH$, where $R_1$, $R_2$, $R_3$, and $R_4$ are independently a $C_1$-$C_4$ alkyl group, a hydroxyethyl group, a phenyl group, or a benzyl group; at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted 2,4-diamino-1,3,5-triazines wherein the 6-substituent is selected from a $C_1$-$C_4$ alkyl group and a substituted or unsubstituted aryl group; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one aluminum corrosion inhibitor selected from phosphoric acids and salts of phosphoric acids; at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant.

In some embodiments, the stripping compositions of this disclosure contain, consist, or consist essentially of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent selected from dimethylsulfoxide, sulfolane, gamma-butyrolactone, and N-methylpyrrolidone; at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one water soluble alcohol solvent selected from glycols, alkoxyalcohols, and tetrahydrofurfuryl alcohol; at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one quaternary ammonium hydroxide selected from quaternary ammonium hydroxide compounds of the general formula $[NR_1R_2R_3R_4]^+OH$, where $R_1$, $R_2$, $R_3$, and $R_4$ are independently a $C_1$-$C_4$ alkyl group, a hydroxyethyl group, a phenyl group, or a benzyl group; at least about 2.5% by weight (e.g., at least about 5% by weight, at least about 7% by weight or at least about 10% by weight) and/or at most about 25% by weight (e.g., at most about 20% by weight, at most about 15% by weight or at most about 12.5% by weight) of water; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted-2,4-diaminotriazines wherein the 6-substituent is selected from a $C_1$-$C_4$ alkyl group and a substituted or unsubstituted aryl group; at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one aluminum corrosion inhibitor selected from 1,2,3-triazole carboxylic acid compounds substituted with a group that under basic conditions is an electron donating group, and 1,2,4-triazole carboxylic acid compounds substituted with a group that under basic conditions is an electron donating group, with the proviso that the triazole carboxylic acids contain one NH moiety in the 1,2,3- or 1,2,4-triazole ring and optionally, at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant.

The stripping compositions of the present disclosure generally are alkaline in nature. In some embodiments, the stripping compositions of the present disclosure has a pH of at least about 13 (e.g., at least about 13.5 or at least about 14). Without wishing to be bound by theory, it is believed that the alkaline nature of the stripping compositions can facilitate removal of a photoresist on a semiconductor substrate.

One embodiment of the present disclosure is a method of stripping photoresist from a semiconductor substrate that includes contacting a semiconductor substrate containing a photoresist with a stripping composition described herein for a time and at a temperature sufficient to remove the photoresist resist from the substrate surface. The method can further include rinsing the semiconductor substrate with a rinse solvent after the contacting step and/or drying the semiconductor substrate after the rinsing step.

In some embodiments, the photoresist stripping method include the steps of:

(A) providing a semiconductor substrate having a photoresist coating;

(B) contacting said semiconductor substrate having a photoresist coating with a stripping composition described herein to remove photoresist;

(C) rinsing said semiconductor substrate with a suitable rinse solvent; and (D) optionally, drying said semiconductor substrate by any means that removes the rinse solvent and does not compromise the integrity of said semiconductor substrate. In some embodiments, the stripping method further includes forming a semiconductor device (e.g., an integrated circuit device such as a semiconductor chip) from the semiconductor substrate obtained by the method described above.

The semiconductor substrates to be stripped in this method have at least one photoresist (e.g., a positive or negative photoresist) that needs to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, nickel, silicon, polysilicon titanium nitride, tantalum nitride, tin, tungsten, SnAg, SnAg/Ni, CuNiSn, CuCoCu, and CoSn. Said semiconductor substrate may also contain layers of interlayer dielectrics, silicon oxide, silicon nitride, silicon carbide, titanium oxide, and carbon doped silicon oxides.

The semiconductor substrate can be contacted with a stripping composition by any suitable method, such as placing the stripping composition into a tank and immersing and/or submerging the semiconductor substrate into the stripping composition, spraying the stripping composition onto the semiconductor substrate, streaming the stripping composition onto the semiconductor substrate, or any combinations thereof. In some embodiments, the semiconductor substrate is immersed into the stripping composition.

The stripping compositions of the present disclosure may be effectively used up to a temperature of about 90° C. In some embodiments, the stripping compositions can be used from about 25° C. to about 80° C. In some embodiments, the stripping compositions can be employed in the temperature range from about 30° C. to about 60° C. In some embodiments the stripping compositions can be employed in the temperature range of about 40° C. to about 60° C. Ultimately for safety reasons, the maximum temperature is kept significantly below the flash points of the solvents being employed.

Similarly, stripping times can vary over a wide range depending on the particular stripping method, temperature and stripping composition employed. When stripping in an immersion batch type process, a suitable time range is, for example, up to about 60 minutes. In some embodiments, a suitable time range for a batch type process is from about 1 minute to about 60 minutes. In some embodiments, a suitable time range for a batch type process is from about 3 minutes to about 20 minutes. In some embodiments, a suitable time range for a batch type stripping process is from about 4 minutes to about 15 minutes.

Stripping times for a single wafer process may range from about 10 seconds to about 5 minutes. In some embodiments, a stripping time for a single wafer process may range from about 15 seconds to about 4 minutes. In some embodiments, a stripping time for a single wafer process may range from about 15 seconds to about 3 minutes. In some embodiments, a stripping time for a single wafer process may range from about 20 seconds to about 2 minutes. In some embodiments, one or more applications of stripping composition may take place. The volume of a stripping composition employed in single wafer process is typically sufficient to fully cover the substrate, which will depend on the substrate size and the surface tension of the stripping composition.

To further promote the stripping ability of the stripping compositions of the present disclosure, mechanical agitation means may be employed. Examples of suitable agitation means include circulation of a stripping composition over the substrate, streaming or spraying a stripping composition over the substrate, and ultrasonic or megasonic agitation during the stripping process. The orientation of the semiconductor substrate relative to the ground may be at any angle. In some embodiments, horizontal or vertical orientations are suitable.

The stripping compositions of the present disclosure can be used in conventional stripping tools known to those skilled in the art. A significant advantage of the stripping compositions of the present disclosure is that they include relatively non-toxic, non-corrosive, and non-reactive components in whole and in part, whereby the compositions are stable in a wide range of temperatures and process times. The stripping compositions of the present disclosure are generally chemically compatible with practically all materials used to construct existing and proposed semiconductor wafer stripping process tools for batch and single wafer stripping.

Subsequent to the stripping, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. In some embodiments, examples of rinse solvents include, but are not limited to, DI water, methanol, ethanol and isopropyl alcohol. In some embodiments, rinse solvents are DI water and isopropyl alcohol. In some embodiments, the rinse solvent is DI water. The solvent may be applied using means similar to that used in applying a stripping composition described herein. The stripping composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the semiconductor substrate can subsequently be processed to form one or more additional circuits on the substrate or can be processed to form into a semiconductor chip by, for example, assembling (e.g., dicing and bonding) and packaging (e.g., chip sealing).

EXAMPLES

The present disclosure is illustrated in more detail with reference to the following examples, which are for illustrative purposes and should not be construed as limiting the scope of the present disclosure.

General Procedure 1 (Stripper Formulation)

Stripping compositions were prepared by mixing, while stirring, the organic solvents, and ultra-pure deionized water (DIW). Aqueous (25%) TMAH was added slowly while stirring, followed by the Cu inhibitor. After a uniform solution was achieved, the optional additives, if used, were added. All components used were commercially available and of high purity.

pH measurements, if desired, were taken at ambient temperature (17-25° C.) after all components were fully dissolved. Beckman Coulter ϕ 400 Series Handheld meters can be used for these pH measurements. pH measurements for most samples were >13, but the typically low concentration of water makes their measurement unreliable.

General Procedure 2 (Stripping Tests)

Stripping tests were conducted using customer provided full 200 mm or 300 mm wafers. The customer-provided wafers with thick positive or negative-tone resists were diced into small coupons containing integral dies for the stripping tests. The samples were placed in a 600 mL volume glass beaker containing approximately 200 mL of the stripping compositions of the present disclosure. Prior to immersion of a sample into a stripping composition, the stripping composition was pre-heated to the test condition temperature (typically 50° C. to 80° C.) on a hotplate set at approximately 250 rpm for controlled solution agitation. The stripping tests were then carried out by placing the sample into the heated stripping composition with device side "face to" the stir bar and leaving the sample in the solution with constant agitation for the test condition time (typically 0.5 to 10 minutes). Once the sample was exposed in the solution for the duration of the test condition, the sample was quickly removed from the test solution with a pair of plastic "locking" tweezers, and placed in a 600 mL plastic beaker filled with approximately 500 mL of ultra-pure deionized water at ambient temperature (~17° C.). The sample was left in the beaker of deionized water for approximately 10-20 seconds with mild agitation, and then removed and placed under an ultra-pure de-ionized water stream (flow rate ~2 L/min) at ambient temperature for an additional 40-50 seconds, and then removed. Upon removal, the sample was immediately exposed to nitrogen gas from a hand held nitrogen blowing gun which caused any droplets on the sample surface to be blown off the sample, and further to completely dry the sample device surface and backside. Following this final nitrogen drying step, the sample was removed from the plastic tweezers holder and placed into a covered plastic carrier with the device side up for short term storage no greater than about 2 hours. Scanning electron microscopy (SEM) images were then collected for key features (i.e. SnAg/Ni bumps) on the stripped test sample device surface.

General Procedure 3 (Etch Rate Measurements)

Etch rates of various substrate materials were measured to determine the corrosivity of tested stripping compositions. Coupons (Cu, Al, W, Ni, Sn, Co, silicon nitride, or poly-Si) from wafers having a coating of the photoresist material being tested were immersed in a certain volume of a test stripping composition pre-heated to the test condition temperature. After immersion in the test stripping composition for the duration of the test condition time, the coupons were quickly removed from the test composition with a pair of plastic "locking" tweezers, rinsed by deionized water, blow dried by $N_2$ gas flow.

The thickness of dielectric films on the coupons before and after dipping in the test composition was measured by either an Ellipsometer or Filmetrics film thickness measuring devices. The difference in film thickness divided by the etch time was used to calculate the etch rate.

The sheet resistance of the metal film on the coupons before and after dipping in the test composition was measured by a Resmap 4-point probe instrument. On metals except Sn, a correlation between film thickness and sheet resistance was employed to determine film thickness. The etch rate was determined by dividing the film thickness change by the immersion time in the composition.

General Procedure 4 (Anti-Foaming Tests)

Anti-foaming tests were conducted in a 100 mL graduated cylinder. 30 mL of a test solution liquid was put into a 100 mL graduated cylinder and the top of cylinder was covered tightly by PARAFILM® M. The graduated cylinder was shaken for 30 sec. The total volume of liquid and foam was recorded at the time of 0 s, 10 s, 30 s, 1 min, and in some cases longer times (e.g., 5 min).

Examples 1-2 and Comparative Examples CE-1-CE-13

Screening of Cu Corrosion Inhibitors

Eighteen experimental stripping compositions with additives were formulated according to General Procedure 1 to screen for inhibition of the copper etching that may occur during photoresist stripping. The copper etch rate tests were performed on blanket copper wafer coupons in the test solutions at 70° C. for 10 minutes following General Procedure 3. The formulations and the etch results are shown in Table 1.

TABLE 1

| Formulation #/ Example # | DMSO | 3-methoxy-3-methyl butanol | TMAH | Water | Additive (0.5%) | Cu Etch Rate (Å/min) |
|---|---|---|---|---|---|---|
| CFE-1/CEx-1 | 77.34% | 12.74% | 2.48% | 7.44% | none | 30.6 |
| FE-1/Ex-1 | 76.85% | 12.74% | 2.48% | 7.44% | Benzoguanamine | 1.6 |
| CFE-2/CEx-2 | 76.85% | 12.74% | 2.48% | 7.44% | Theophylline | 30.1 |
| CFE-3/CEx-2 | 76.85% | 12.74% | 2.48% | 7.44% | 3,5-dimethylpyrazole | 65.2 |

TABLE 1-continued

| Formulation #/ Example # | DMSO | 3-methoxy-3-methyl butanol | TMAH | Water | Additive (0.5%) | Cu Etch Rate (Å/min) |
|---|---|---|---|---|---|---|
| CFE-4/CEx-4 | 76.85% | 12.74% | 2.48% | 7.44% | 1,3-benzendiol | 12.2 |
| CFE-5/CEx-5 | 76.85% | 12.74% | 2.48% | 7.44% | Barbituric acid | 38.1 |
| FE-2/Ex-2 | 76.85% | 12.74% | 2.48% | 7.44% | 6-methyl-1,3,5-triazine-2,4-diamine | 3.6 |
| CFE-6/CEx-6 | 76.85% | 12.74% | 2.48% | 7.44% | 2-amino-pyrimidine | 36.1 |
| CFE-7/CEx-7 | 77.34% | 12.74% | 2.48% | 7.44% | none | 20.4 |
| CFE-8/CEx-8 | 76.85% | 12.74% | 2.48% | 7.44% | 6-nitro-indazole | 24.3 |
| CFE-9/CEx-9 | 76.85% | 12.74% | 2.48% | 7.44% | 1,3-dimethyl-2-imidazolidinone | 19.2 |
| CFE-10/CEx-10 | 76.85% | 12.74% | 2.48% | 7.44% | 5,6-dimethyl benzimidazole | 22 |
| CFE-11/CEx-11 | 76.85% | 12.74% | 2.48% | 7.44% | Tritolyl phosphate | 16.4 |
| CFE-12/CEx-12 | 76.85% | 12.74% | 2.48% | 7.44% | Hydroquinone | 75.9 |
| CFE-13/CEx-13 | 76.60% | 12.74% | 2.48% | 7.44% | Hydroquinone; Citric acid (0.25%) | 45.9 |

The results demonstrate that the two diamino-1,3,5-triazines (i.e., 2,4-diamino-6-phenyl-1,3,5-triazine (benzoguanamine) and 6-methyl-1,3,5-triazine-2,4-diamine in FE-1 and FE2 were surprisingly the most effective among the Cu corrosion inhibitors tested in the above Examples.

Examples 3-6

Effect of Water Concentration on Cu Etch Rate in an Inhibited Quaternary Ammonium Hydroxide/Polar Solvent Based Stripper Stripper formulations containing amounts of water ranging from 7.5% to 22.5% were prepared according to General Procedure 1. Cu films from two different sources were treated with the stripping formulations according to General Procedure 3 at 70° C. for 10 minutes and the resulting etch rates measured. The stripping formulations and the etch results are shown in Table 2.

TABLE 2

| Form. #/ Example # | DMSO | 3-methoxy-3-methyl butanol | TMAH | Water | Benzo-guanamine | Etch rate (Å/min) Source 1 Cu | Etch rate (Å/min) Source 2 Cu |
|---|---|---|---|---|---|---|---|
| FE-3/Ex-3 | 77.50% | 12.00% | 2.50% | 7.50% | 0.50% | 1.5 | 1.3 |
| FE-4/Ex-4 | 72.50% | 12.00% | 2.50% | 12.50% | 0.50% | 1.4 | 1.4 |
| FE-5/Ex-5 | 67.50% | 12.00% | 2.50% | 17.50% | 0.50% | 1.3 | 1.5 |
| FE-6/Ex-6 | 62.50% | 12.00% | 2.50% | 22.50% | 0.50% | 1.6 | 1.7 |

The results show that, within the tested water content range, the Cu etch rate did not significantly change with the increasing amount of water in the tested stripping compositions.

Examples 7-15

In Examples 7-15, stripping compositions prepared by General Procedure 1 containing alternative alcoholic solvents at multiple concentrations were employed to treat Cu films according to General Procedure 3 at 70° C. for 10 minutes. The effect of changing the alcoholic solvent and its concentration in the quaternary ammonium hydroxide/polar solvent based stripper on the Cu etch rate is shown in Table 3.

TABLE 3

| Form. #/ Example # | DMSO | co-solvent | TMAH | Water | Benzoguanamine | Etch rate (Å/min) Type 1 Cu |
|---|---|---|---|---|---|---|
| FE-3/Ex-7 | 77.50% | 3-methoxy-3-methyl butanol 12% | 2.50% | 7.50% | 0.50% | <1 Å/min |
| FE-7/Ex-8 | 77.50% | Di(ethylene glycol) ethyl ether 12% | 2.50% | 7.50% | 0.50% | <1 Å/min |
| FE-8/Ex-9 | 64.50% | Di(ethylene glycol) ethyl ether 25% | 2.50% | 7.50% | 0.50% | <1 Å/min |
| FE-9/Ex-10 | 49.50% | Di(ethylene glycol) ethyl ether 40% | 2.50% | 7.50% | 0.50% | <1 Å/min |
| FE-10/Ex-11 | 29.50% | Di(ethylene glycol) ethyl ether 60% | 2.50% | 7.50% | 0.50% | <1 Å/min |
| FE-11/Ex-12 | 77.50% | Hexylene glycol 12% | 2.50% | 7.50% | 0.50% | <1 Å/min |
| FE-12/Ex-13 | 64.50% | Hexylene glycol 25% | 2.50% | 7.50% | 0.50% | <1 Å/min |
| FE-13/Ex-14 | 49.50% | Hexylene glycol 40% | 2.50% | 7.50% | 0.50% | <1 Å/min |
| FE-14/Ex-15 | 29.50% | Hexylene glycol 60% | 2.50% | 7.50% | 0.50% | <1 Å/min |

Di(ethyleneglycol) ethyl ether is also known as Diethylene glycol monoethyl ether and ethyl diglycol.

The results show that changes of the tested alcoholic solvents and their concentrations did not significantly affect the corrosion inhibition even over a significant concentration range (i.e., 12%-60%).

Examples 16-17

Effect of Surfactant on Cu Etch Rate

In Examples 16-17, stripping compositions prepared by General Procedure 1 containing a defoaming surfactant were employed to treat Cu films according to General Procedure 3 at 70° C. for 10 minutes. The effect of the defoaming surfactant in a stripping composition of this disclosure on the Cu etch rate is shown in Table 4.

TABLE 4

| Form. #/ Example # | DMSO | 3-methoxy-3-methyl butanol | TMAH | Water | Benzo-guanamine | Surfynol MD-20 | Etch rate (Å/min) Source 1 Cu | Etch rate (Å/min) Source 2 Cu | Etch rate (Å/min) Source 3 Cu |
|---|---|---|---|---|---|---|---|---|---|
| FE-16/Ex-16 | 72.30% | 12.00% | 2.50% | 12.50% | 0.50% | 0.20% | 1.7 | 1.3 | 1.9 |
| FE-16/Ex-17 | 72.44% | 12.00% | 2.50% | 12.50% | 0.50% | 0.06% | 1.5 | 1.1 | 1.6 |

The results in Table 4 show that the effect of surfactant addition on the Cu etch rate is minimal, and was considered to be within experimental error.

Examples 18-34

Thick Resist Stripping Tests

In Examples 18-34, stripping compositions prepared by General Procedure 1 and shown in Table 5 were employed to strip photoresist coated over SnAg/Ni bumps on a silicon substrate according to General Procedure 2 at 70° C. for 5, 15, and 30 minutes. The effect of varying the water content, the DMSO content or the specific alcoholic solvent in the stripper composition was studied in these examples.

TABLE 5

| Form. #/ Example # | DMSO | Co-Solvent (12%) | Tetramethyl ammonium hydroxide [TMAH] | water | Benzo-guanamine | Surfynol MD-20 |
|---|---|---|---|---|---|---|
| FE-3/Ex. 18 | 77.50% | 3-methoxy-3-methyl butanol | 2.50% | 7.50% | 0.50% | 0 |
| FE-4/Ex. 19 | 72.50% | 3-methoxy-3-methyl butanol | 2.50% | 12.50% | 0.50% | 0 |
| FE-5/FE-20 | 67.50% | 3-methoxy-3-methyl butanol | 2.50% | 17.50% | 0.50% | 0 |
| FE-6/Ex. 21 | 62.50% | 3-methoxy-3-methyl butanol | 2.50% | 22.50% | 0.50% | 0 |
| FE-17/Ex. 22 | 77.30% | 3-methoxy-3-methyl butanol | 2.50% | 7.50% | 0.50% | 0.20% |
| FE-18/Ex. 23 | 76.30% | 3-methoxy-3-methyl butanol | 2.50% | 8.50% | 0.50% | 0.20% |
| FE-19/Ex. 24 | 75.30% | 3-methoxy-3-methyl butanol | 2.50% | 9.50% | 0.50% | 0.20% |
| FE-20/Ex. 25 | 74.30% | 3-methoxy-3-methyl butanol | 2.50% | 10.50% | 0.50% | 0.20% |
| FE-21/Ex. 26 | 73.30% | 3-methoxy-3-methyl butanol | 2.50% | 11.50% | 0.50% | 0.20% |
| FE-16/Ex. 27 | 72.30% | 3-methoxy-3-methyl butanol | 2.50% | 12.50% | 0.50% | 0.20% |
| FE-22/Ex. 28 | 82.30% | di(ethylene glycol) ethyl ether | 2.50% | 2.50% | 0.50% | 0.20% |
| FE-23/Ex. 29 | 77.30% | di(ethylene glycol) ethyl ether | 2.50% | 7.50% | 0.50% | 0.20% |
| FE-24/Ex. 30 | 76.30% | di(ethylene glycol) ethyl ether | 2.50% | 8.50% | 0.50% | 0.20% |
| FE-25/Ex. 31 | 75.30% | di(ethylene glycol) ethyl ether | 2.50% | 9.50% | 0.50% | 0.20% |
| FE-26/Ex. 32 | 74.30% | di(ethylene glycol) ethyl ether | 2.50% | 10.50% | 0.50% | 0.20% |
| FE-27/Ex. 33 | 73.30% | di(ethylene glycol) ethyl ether | 2.50% | 11.50% | 0.50% | 0.20% |
| FE-28/Ex. 34 | 72.30% | di(ethylene glycol) ethyl ether | 2.50% | 12.50% | 0.50% | 0.20% |

Analysis of SEM images showed that all of the strippers listed in Table 5 satisfactorily removed the photoresist from the silicon substrate having SnAg/Ni bumps. The analysis suggested that a water concentration in the stripper of less than 10.5% is preferred to avoid etching of the SnAg/Ni bump.

Examples 35-43

Additional Thick Resist Stripping Tests

In Examples 35-43, stripping compositions prepared by General Procedure 1 and shown in Table 6 were employed to strip photoresist coated over SnAg/Ni bumps on a silicon substrate according to General Procedure 2 at 70° C. for 5, 15, and 30 minutes to explore the effect of varying the alcoholic solvent concentration for two alcoholic solvents (i.e., di(ethylene glycol) ethyl ether and hexylene glycol).

TABLE 6

| Form. #/ Example # | DMSO | 3-methoxy-3-methyl butanol | Di(ethylene glycol) ethyl ether | Hexylene glycol | TMAH | Water | Benzo-guanamine |
|---|---|---|---|---|---|---|---|
| FE-3/Ex-35 | 77.50% | 12.00% | | | 2.50% | 7.50% | 0.50% |
| FE-7/Ex-36 | 77.50% | | 12.00% | | 2.50% | 7.50% | 0.50% |

TABLE 6-continued

| Form. #/ Example # | DMSO | 3-methoxy-3-methyl butanol | Di(ethylene glycol) ethyl ether | Hexylene glycol | TMAH | Water | Benzo-guanamine |
|---|---|---|---|---|---|---|---|
| FE-8/Ex-37 | 64.50% | | 25.00% | | 2.50% | 7.50% | 0.50% |
| FE-9/Ex-38 | 49.50% | | 40.00% | | 2.50% | 7.50% | 0.50% |
| FE-10/Ex-39 | 29.50% | | 60.00% | | 2.50% | 7.50% | 0.50% |
| FE-11/Ex-40 | 77.50% | | | 12.00% | 2.50% | 7.50% | 0.50% |
| FE-12/Ex-41 | 64.50% | | | 25.00% | 2.50% | 7.50% | 0.50% |
| FE-13/Ex-42 | 49.50% | | | 40.00% | 2.50% | 7.50% | 0.50% |
| FE-14/Ex-43 | 29.50% | | | 60.00% | 2.50% | 7.50% | 0.50% |

Analysis of SEM images using FE-3 as the benchmark show performance effects of the two other alcoholic solvents (i.e., di(ethylene glycol) ethyl ether and hexylene glycol) and their concentrations in the stripping composition. The analysis showed that, as the concentration of these two alcoholic solvents increased, the stripping rate of the photoresist decreased. Longer stripping times can be employed to adjust for lower photoresist stripping rates. The glycol had a slower photoresist stripping rate relative to 3-methoxy-3-methylbutanol and di(ethylene glycol) ethyl ether. The analysis suggested that, concentrations of the alcoholic solvent in the 12-25% range gave preferred results, but the range will depend on the exact alcohol solvent used.

Examples 44-49

Additional Thick Resist Stripping Tests

In Examples 44-49, stripping compositions prepared by General Procedure 1 and shown in Table 7 were employed to strip photoresist coated over SnAg/Ni bumps on a silicon substrate according to General Procedure 2 at 70° C. for 5, 15, 30, and 60 minutes to explore the effect of the surfactant on the photoresist stripping.

TABLE 7

| Form. #/ Example # | DMSO | 3-methoxy-3-methyl butanol | Di(ethylene glycol) ethyl ether | TMAH | Water | Benzo-guanamine | Surfynol MD-20 |
|---|---|---|---|---|---|---|---|
| FE-3/Ex-44 | 77.50% | 12.00% | | 2.50% | 7.50% | 0.50% | |
| FE-29/Ex-45 | 77.30% | 12.00% | | 2.50% | 7.50% | 0.50% | 0.20% |
| FE-7/Ex-46 | 77.50% | | 12.00% | 2.50% | 7.50% | 0.50% | |
| FE-30/Ex-47 | 77.30% | | 12.00% | 2.50% | 7.50% | 0.50% | 0.20% |
| FE-15/Ex-48 | 72.30% | 12.00% | | 2.50% | 12.50% | 0.50% | 0.20% |
| FE-16/Ex-49 | 72.44% | 12.00% | | 2.50% | 12.50% | 0.50% | 0.06% |

Analysis of SEM images showed that the presence of the surfactant in various formulations had no negative effect on the photoresist stripping or etching the SnAg/Ni bump.

Examples 50-52

Foam Suppression

Three stripping compositions described in Table 8 were formulated according to General Procedure 1. A 300 mm wafer was coated with a 70 micron thick film. 45% of the resist coating on the wafer was dissolved in 100 mL of the stripping composition employed in Example 50. This was repeated using 45% of a wafer coating on each of the compositions employed in Examples 51 and 52. 30 mL portions of a stripping composition were tested for foam formation according to General Procedure 4. Additional aliquots of each stripping composition were spiked with amounts of Surfynol MD-20 surfactant and tested for foam suppression also according to General Procedure 4. The amount of surfactant and the foam suppression data are reported in Table 9.

TABLE 8

| Form. #/ Example # | DMSO | 3-methoxy-3-methyl butanol | Di(ethylene glycol) ethyl ether | TMAH | Water | Benzo-guanamine |
|---|---|---|---|---|---|---|
| FE-31/Ex-50 | 72.50% | 12.00% | | 2.50% | 12.50% | 0.50% |
| FE-7/Ex-51 | 77.50% | | 12.00% | 2.50% | 7.50% | 0.50% |
| FE-32/Ex-52 | 75.50% | | 12.00% | 2.50% | 9.50% | 0.50% |

TABLE 9

| Example Number | Starting Formulation | MD-20 concentration | Initial total height (ml) | total height after 10 sec. (ml) | total height after 30 sec. (ml) | total height after 60 sec. (ml) |
|---|---|---|---|---|---|---|
| 50a | FE-31 | none | 50 | 52 | 52 | 51 |
| 50b | FE-31 | 600 ppm | 33 | 33 | 31 | 30 |
| 50c | FE-31 | 1300 ppm | 32 | 32 | 31 | 30 |
| 50d | FE-31 | none | 55 | 55 | 53 | 50 |
| 50e | FE-31 | 300 ppm | 36 | 34 | 31 | 30 |
| 50f | FE-31 | 300 ppm (after ~22 hr) | 33 | 32 | 31 | 30 |
| 51a | FE-7 | none | >100 | 57 | 55 | 54 |
| 51b | FE-7 | ~1200-1300 ppm | 33 | 32 | 31 | 31 |
| 52a | FE-32 | none | >100 | 58 | 57 | 57 |
| 52b | FE-32 | ~1200-1300 ppm | 33 | 32 | 32 | 32 |

As seen in Table 9, the stripping compositions without the defoaming surfactant foamed significantly during the shaking of the graduated cylinder. The foam levels for the three stripping compositions without a defoaming surfactant after 5 minutes, were 35 mL, 54 mL, and 54 mL respectively (not shown in Table 9). The stripping compositions containing the defoaming surfactant MD-20 had little foam after shaking.

Examples 53-64 and 84 and

Comparative Examples CEx-14-CEx-38 and CEx-40-CEx-55

Additive Screening for Inhibition of Aluminum Etching

Photoresist stripping compositions with additives to screen for inhibiting aluminum etching were formulated according to General Procedure 1 to screen for inhibition of aluminum etching that may occur during photoresist stripping over Al containing substrates or devices. The aluminum etch rate tests were performed on blanket aluminum wafer coupons in the test solutions at 70° C. for 6 minutes following General Procedure 3 using Al. Blanket aluminum films were 500 nm thick. All potential aluminum inhibitors were screened using the blanket film. Dummy aluminum bond pads were used to confirm the low etch rate on patterned coupons using selected formulations. Dummy aluminum bond pads were tested for 1, 2, & 5 minutes in selected formulation. Scanning electron micrographs of the bond pads were taken to qualitatively correlate the surface roughness with the measured etch rate.

The formulations and the etch results are shown in Tables 10 and 11. FE-3 was employed as the baseline composition in each batch of compositions screened to check effects on the aluminum etch rate.

TABLE 10

| Form. #/ Example # | DMSO | 3-methoxy-3-methyl-1-butanol | TMAH | Water | Benzo-guanamine | additive (%) | Al Etch Rate (Å/min) |
|---|---|---|---|---|---|---|---|
| FE-3/ Ex-53 | 77.50% | 12.00% | 2.50% | 7.50% | 0.50% | none | >700 |
| CFE-14/ CEx-14 | 77.00% | 12.00% | 2.50% | 7.50% | 0.50% | Isostearyl ethylimidonium ethosulfate (0.5%) | >700 |
| CFE-15/ CEx-15 | 77.00% | 12.00% | 2.50% | 7.50% | 0.50% | Stearylbenzyldimethyl ammonium chloride (0.5%) | >700 |
| CFE-16/ CEx-16 | 77.00% | 12.00% | 2.50% | 7.50% | 0.50% | Hexadecyltrimethyl ammonium chloride (0.5%) | >700 |
| CFE-17/ CEx-17 | 77.00% | 12.00% | 2.50% | 7.50% | 0.50% | Carboshield 1000 (0.5%) | >700 |
| CFE-18/ CEx-18 | 77.00% | 12.00% | 2.50% | 7.50% | 0.50% | Boric acid (0.5%) | 263 |
| CFE-19/ CEx-19 | 77.00% | 12.00% | 2.50% | 7.50% | 0.50% | mercaptobenz-imidazole (0.5%) | >700 |
| CFE-20/ CEx-20 | 77.00% | 12.00% | 2.50% | 7.50% | 0.50% | AES surfactant (0.5%) | >700 |
| FE-3/ Ex-54 | 77.50% | 12.00% | 2.50% | 7.50% | 0.50% | none | 667 |
| CFE-21/ CEx-21 | 77.00% | 12.00% | 2.50% | 7.50% | 0.50% | Phenylboronic acid (0.5%) | >700 |
| FE-33/ Ex-55 | 77.00% | 12.00% | 2.50% | 7.50% | 0.50% | Phosphoric acid (0.5%) | 199 |
| CFE-22/ CEx-22 | 77.00% | 12.00% | 2.50% | 7.50% | 0.50% | Phenylphosphonic acid (0.5%) | >700 |
| CFE-23/ CEx-23 | 76.50% | 12.00% | 2.50% | 7.50% | 0.50% | methyltrimethoxy-silane (1%) | 241 |
| FE-3/ Ex-56 | 77.50% | 12.00% | 2.50% | 7.50% | 0.50% | none | >600 |
| FE-34/ Ex-57 | 76.30% | 12.00% | 2.50% | 7.68% | 0.50% | Phosphoric acid (1.02%) | 39 |
| CFE-24/ CEx-24 | 76.50% | 12.00% | 2.50% | 7.50% | 0.50% | Phthalic acid (1) | 458 |
| CFE-25/ CEx-25 | 76.50% | 12.00% | 2.50% | 7.50% | 0.50% | Catechol (1%) | 274 |
| CFE-26/ CEx-26 | 76.50% | 12.00% | 2.50% | 7.50% | 0.50% | Ascorbic acid (1%) | 220 |

TABLE 10-continued

| Form. #/ Example # | DMSO | 3-methoxy-3-methyl-1-butanol | TMAH | Water | Benzo-guanamine | additive (%) | Al Etch Rate (Å/min) |
|---|---|---|---|---|---|---|---|
| CFE-27/ CEx-27 | 72.50% | 12.00% | 2.50% | 7.50% | 0.50% | 1,4-butanediol (5.%) | 356 |
| CFE-28/ CEx-28 | 72.50% | 12.00% | 2.50% | 7.50% | 0.50% | 2,2-dimethyl-1,3-propanediol (5%) | >700 |
| CFE-29/ CEx-29 | 76.50% | 12.00% | 2.50% | 7.50% | 0.50% | Citric acid (1%) | 211 |
| CFE-30/ CEx-30 | 76.50% | 12.00% | 2.50% | 7.50% | 0.50% | Bis(2,4,4-trimethylpentyl) phosphinic acid (1%) | 470 |
| FE-3/ Ex-58 | 77.50% | 12.00% | 2.50% | 7.50% | 0.50% | none | 649 |
| CFE-31/ CEx-31 | 76.50% | 12.00% | 2.50% | 7.50% | 0.50% | Salicylic acid (%) | 660 |
| CFE-32/ CEx-32 | 76.50% | 12.00% | 2.50% | 7.50% | 0.50% | Malonic acid (1%) | 249 |
| CFE-33/ CEx-33 | 76.50% | 12.00% | 2.50% | 7.50% | 0.50% | Diglycolic acid (1%) | 304 |
| CFE-34/ CEx-34 | 76.50% | 12.00% | 2.50% | 7.50% | 0.50% | Oxalic acid (1%) | 249 |
| FE-35/ Ex-59 | 76.50% | 12.00% | 2.50% | 7.50% | 0.50% | Polyphosphoric acid (1%) | 64 |
| CFE-35/ CEx-35 | 76.50% | 12.00% | 2.50% | 7.50% | 0.50% | Arginine (1%) | >700 |
| CFE-36/ CEx-36 | 76.50% | 12.00% | 2.50% | 7.50% | 0.50% | Histidine (1%) | >700 |
| CFE-37/ CEx-37 | 76.50% | 12.00% | 2.50% | 7.50% | 0.50% | Cysteine (1%) | 607 |
| FE-36/ Ex-60 | 76.50% | 12.00% | 2.50% | 7.50% | 0.50% | Ammonium phosphate monobasic (1%) | 75 |
| CFE-38/ CEx-38 | 77.50% | 12.00% | 2.50% | 7.50% | 0.50% | Tritolyl phosphate (1%) | >700 |
| FE-73/ Ex-84 | 75.84% | 12.00% | 2.50% | 8.66% | 0.50% | Hexyldecyl(2-hydroethoxyethyl) dimethyl ammonium dihydrogen phosphate (0.5%) | 409 |
| CFE-40/ CEx-40 | 76.50% | 12.00% | 2.50% | 7.50% | 0.50% | Methanesulfonic acid (MSA) (1%) | 558 |
| CFE-41/ CEx-41 | 76.40% | 12.00% | 2.50% | 7.60% | 0.50% | p-toluenesulfonic acid (p-TSA) (1%) | 467 |

TABLE 11

Screening for Additives to Inhibit Aluminum Etching

| Form. #/ Example # | DMSO | 3-methoxy-3-methyl-1-butanol | TMAH | Water | Benzo-guanamine | Surfynol MD-20 | additive | Al Etch Rate (Å/min) |
|---|---|---|---|---|---|---|---|---|
| FE-37/ Ex-61 | 76.12% | 12.00% | 2.50% | 7.68% | 0.50% | 0.20% | Phosphoric acid (1%) | 42 |
| CFE-42/ CEx-42 | 76.30% | 12.00% | 2.50% | 7.50% | 0.50% | 0.20% | DBU (1 %) | 808 |
| FE-38/ Ex-62 | 76.21% | 12.00% | 2.50% | 7.59% | 0.50% | 0.20% | DBU (0.5%) Phosphoric (0.5%) | 101 |
| FE-39/ Ex-63 | 75.46% | 12.00% | 2.50% | 8.34% | 0.50% | 0.2% (NSF-40 surfactant (0.5%)) | Phosphoric acid (0.5%) | 148 |
| FE-40/ Ex-64 | 46.71% (NMP 30%) | 12.00% | 2.50% | 7.59% | 0.50% | 0.20% | Phosphoric acid (0.5%) | 145 |
| CFE-43/ CEx-43 | 76.30% | 12.00% | 2.50% | 7.50% | 0.50% | 0.20% | maleic acid (1) | 285 |
| CFE-44/ CEx-44 | 76.30% | 12.00% | 2.50% | 7.50% | 0.50% | 0.20% | succinic acid (1) | 362 |
| CFE-45/ CEx-45 | 76.30% | 12.00% | 2.50% | 7.50% | 0.50% | 0.20% | 3,5-dimethylpyrazole (1%) | 815 |
| CFE-46/ CEx-46 | 76.30% | 12.00% | 2.50% | 7.50% | 0.50% | 0.20% | 2-mercapto benzothiazole (1%) | >791 |

TABLE 11-continued

Screening for Additives to Inhibit Aluminum Etching

| Form. #/ Example # | DMSO | 3-methoxy-3-methyl-1-butanol | TMAH | Water | Benzo-guanamine | Surfynol MD-20 | additive | Al Etch Rate (Å/min) |
|---|---|---|---|---|---|---|---|---|
| CFE-47/ CEx-47 | 76.30% | 12.00% | 2.50% | 7.50% | 0.50% | 0.20% | Glutaric acid (1%) | 310 |
| CFE-48/ CEx-48 | 76.30% | 12.00% | 2.50% | 7.50% | 0.50% | 0.20% | N,N,N',N'-tetramethyl-p-phenylenediamine (1%) | 639 |
| CFE-49/ CEx-49 | 76.30% | 12.00% | 2.50% | 7.50% | 0.50% | 0.20% | PEI, PEI branched (1%) | 803 |
| CFE-50/ CEx-50 | 76.30% | 12.00% | 2.50% | 7.50% | 0.50% | 0.20% | 6-methyl-1,3,5-triazine-2,4-diamine (1%) | 781 |
| CFE-51/ CEx-51 | 76.30% | 12.00% | 2.50% | 7.50% | 0.50% | 0.20% | pyrazole (1%) | 603 |
| CFE-52/ CEx-52 | 76.30% | 12.00% | 2.50% | 7.50% | 0.50% | 0.20% | 5-aminotetrazole (1%) | 793 |
| CFE-53/ CEx-53 | 76.30% | 12.00% | 2.50% | 7.50% | 0.50% | 0.20% | 5-phenyl-1H-tetrazole (1%) | 794 |
| CFE-54/ CEx-54 | 76.23% | 11.99% | 2.52% | 7.56% | 0.50% | 0.20% | benzoic acid (1%) | 829 |
| CFE-55/ CEx-55 | 76.23% | 11.99% | 2.52% | 7.56% | 0.50% | 0.20% | 3-amino-5-methylthio-1H-1,2,4-triazole (1%) | 800 |

The results in Tables 10 and 11 showed that various additives could affect the aluminum etch rate (positively or negatively) in the stripping compositions, but at the approximately 1% level of additive, only phosphoric acid, several phosphoric acid salts, polyphosphoric acid, and a combination of 3-amino-1,2,4-triazole-5-carboxylic acid and calcium cation could significantly lower the Al etch rate (e.g., to approximately 100 Å/min or lower). The 3-amino-1,2,4-triazole-5-carboxylic acid additive surprisingly gave an Al etch rate of less than 1 Å/min.

Examples 66-77

Concentration Studies of Al Inhibitors

Stripping compositions with additives were formulated according to General Procedure 1 to study concentration effects of the additives on the inhibition of aluminum etching that may occur during photoresist stripping. The aluminum etch rate tests were performed on blanket aluminum wafer coupons in the test solutions at 70° C. for 6 minutes following General Procedure 3. The formulations contained various concentrations of phosphoric acid or a combination of 3-amino-1,2,4-triazole-5-carboxylic acid and calcium cation. The formulations and etch results are shown in Table 12 (phosphoric acid) and Table 13 (a combination of 3-amino-1,2,4-triazole-5-carboxylic acid and calcium cation).

TABLE 12

Concentration Effect of Phosphoric Acid on Al Etch Rates

| Form. #/ Example # | DMSO | 3-methoxy-3-methyl-1-butanol | TMAH | Water | Benzo-guanamine | Surfynol MD-20 | additive | Al Etch Rate (Å/min) |
|---|---|---|---|---|---|---|---|---|
| FE-29/Ex-66 | 77.30% | 12.00% | 2.50% | 7.50% | 0.50% | 0.20% | 0.00% | 419 |
| FE-42/Ex-67 | 77.01% | 12.00% | 2.50% | 7.54% | 0.50% | 0.20% | 0.25% | 94 |
| FE-43/Ex-68 | 76.71% | 12.00% | 2.50% | 7.59% | 0.50% | 0.20% | 0.50% | 63 |
| FE-44/Ex-69 | 76.57% | 12.00% | 2.50% | 7.61% | 0.50% | 0.20% | 0.63% | 54 |
| FE-45/Ex-70 | 76.42% | 12.00% | 2.50% | 7.63% | 0.50% | 0.20% | 0.75% | 51 |
| FE-46/Ex-71 | 76.27% | 12.00% | 2.50% | 7.65% | 0.50% | 0.20% | 0.88% | 33 |
| FE-37/Ex-72 | 76.12% | 12.00% | 2.50% | 7.68% | 0.50% | 0.20% | 1.00% | 29 |
| FE-47/Ex-73 | 75.98% | 12.00% | 2.50% | 7.70% | 0.50% | 0.20% | 1.13% | 22 |

TABLE 13

Concentration Effects of 3-amino-1,2,4-triazole-5-carboxylic acid on Al Etch Rates

| Form. #/ Example # | DMSO | 3-methoxy-3-methyl-1-butanol | TMAH | Water | Benzo-guanamine | Surfynol MD-20 | $Ca^{2+}$ (ppm) | 3-amino-1,2,4-triazole-5-carboxylic acid | Al Etch Rate (Å/min) |
|---|---|---|---|---|---|---|---|---|---|
| FE-29/Ex-74 | 77.3 | 12 | 2.5 | 7.5 | 0.5 | 0.2 | 0 | 0 | 610.2 |
| FE-48/Ex-75 | 77.05 | 12 | 2.5 | 7.5 | 0.5 | 0.2 | 1.8 | 0.25% | 85 |
| FE-49/Ex-76 | 76.8 | 12 | 2.5 | 7.5 | 0.5 | 0.2 | 6.8 | 0.50% | 0 |
| FE-50/Ex-77 | 76.55 | 12 | 2.5 | 7.5 | 0.5 | 0.2 | 11 | 0.75% | 2 |

Both Al etch inhibitor additives yielded a relatively sharp drop in Al etch rate up to a certain concentration of additive.

Examples 79, 80, 85, and 86, and Comparative Examples CEx-56-CEx-67

Screening of Other Triazoles for Aluminum Etch Inhibition

Additional triazoles were screened for their ability to inhibit aluminum etching in the stripping compositions of this disclosure. Stripping compositions were formulated according to General Procedure 1. The aluminum etch rate tests were performed on blanket aluminum wafer coupons in the test solutions at 70° C. for 6 minutes following General Procedure 3. The results are reported in Table 14.

TABLE 14

| Form. #/ Example# | DMSO | 3-methoxy-3-methyl-1-butanol | TMAH | Water | Benzo-guanamine | Surfynol MD-20 | Al inhibitor | Al Etch Rate (Å/min) |
|---|---|---|---|---|---|---|---|---|
| FE-41/ Ex-79 | 76.55 | 12.00 | 2.50 | 7.50 | 0.50 | 0.20 | (3-amino-1,2,4-triazole-5-carboxylic acid hydrate) (0.75%) + $Ca^{2+}$ (11 ppm) | 1.4 |
| CFE-56/ CEx-56 | 76.55 | 12.00 | 2.50 | 7.50 | 0.50 | 0.20 | (3-amino-1,2,4-triazole) (0.75%) | 482 |
| CFE-57/ CEx-67 | 76.55 | 12.00 | 2.50 | 7.50 | 0.50 | 0.20 | (3-amino-1,2,4-triazole-5-thiol) (0.75%) | 479 |
| CFE-58/ CEx-68 | 76.55 | 12.00 | 2.50 | 7.50 | 0.50 | 0.20 | (1,2,4-triazole-3-carboxylic acid) (0.75%) | 479 |
| CFE-59/ CEx-69 | 76.55 | 12.00 | 2.50 | 7.50 | 0.50 | 0.20 | (benzotriazole-5-carboxylic acid) (0.75%) | 485 |
| CFE-60/ CEx-60 | 76.55 | 12.00 | 2.50 | 7.50 | 0.50 | 0.20 | [3-amino-1,2,4-triazole (0.49)] + [acetic acid (0.26)] | 476 |
| CFE-61/ CEx-61 | 76.43 | 12.00 | 2.50 | 7.50 | 0.50 | 0.20 | [3-amino-1,2,4-triazole (0.49)] + [citric acid (0.38)] | 275 |
| FE-42/ Ex-80 | 76.55 | 12.02 | 2.50 | 7.55 | 0.50 | 0.20 | [3-amino-1,2,4-triazole (0.49)] + [phosphoric acid (0.19)] | 123 |

Surprisingly, none of the compositions of CFE-56 to CFE-61 exhibited near the degree of inhibition of the Al etch rate that was exhibited by the composition of FE-41 (which contained a combination of 3-amino-1,2,4-triazole-5-carboxylic acid) and calcium cation). The 3-amino-1,2,4-triazole and the 1,2,4-triazole-3-carboxylic acid had only mild reductions of the Al etch rate, suggesting a need for two functional groups. The formulations containing 3-amino-1,2,4-triazole and an added acid (i.e., citric acid or phosphoric acid) yielded inhibition suggestive of the acid's effect on Al inhibition. This also suggests that the two functional groups are preferably on the same molecule to achieve a lower Al etch rate. However, the result from 3-amino-1,2,4-triazole-5-thiol suggests that a carboxylic acid substituent is preferred as one of the substituents.

The effects of solubilized calcium were evaluated for its ability to inhibit aluminum etching in the stripping compositions of this disclosure. Stripping compositions were formulated according to General Procedure 1. The aluminum etch rate tests were performed on blanket aluminum wafer coupons in the test solutions at 70° C. for 6 minutes following General Procedure 3. The results are reported in Table 15. In Table 15, the first four rows include results from four compositions that contain trace amounts of solubilized calcium as contaminants where no additional calcium was added. The last four rows include results from four compositions in which 0.0074% of calcium oxalate monohydrate was added. The column under "Calcium Dissolved" includes the amounts of the solubilized calcium measured by elemental analysis. As shown in Table 15, only a portion of the added calcium oxalate monohydrate was dissolved in the tested compositions.

TABLE 15

| Form. #/ Example # | DMSO | 3-methoxy-3-methyl-1-butanol | TMAH | Water | Benzo-guanamine | Surfynol MD-20 | Al inhibitor | Calcium Oxalate Monohydrate (%) | Calcium Dissolved (ppb) | Al Etch Rate (Å/min) |
|---|---|---|---|---|---|---|---|---|---|---|
| FE-74/ Ex-85 | 76.55 | 12.00 | 2.50 | 7.50 | 0.50 | 0.20 | (3-amino-1,2,4-triazole-5-carboxylic acid) | 0 | 50 | 592 |
| CFE-62/ CEx-62 | 76.55 | 12.00 | 2.50 | 7.50 | 0.50 | 0.20 | 1,2,4-triazole) (0.75%) | 0 | 195 | 671 |
| CFE-63/ CEx-63 | 76.55 | 12.00 | 2.50 | 7.50 | 0.50 | 0.20 | (3-amino-1,2,4-triazole-5-thiol) | 0 | 12 | 488 |
| CFE-64/ CEx-64 | 76.55 | 12.00 | 2.50 | 7.50 | 0.50 | 0.20 | (1,2,4-triazole-3-carboxylic acid) | 0 | 29 | 566 |
| FE-75/ Ex-86 | 76.55 | 12.00 | 2.50 | 7.50 | 0.50 | 0.20 | (3-amino-1,2,4-triazole-5-carboxylic acid hydrate) (0.75%) | 0.0074 | 7600 | 4 |
| CFE-66/ CEx-65 | 76.55 | 12.00 | 2.50 | 7.50 | 0.50 | 0.20 | (3-amino-1,2,4-triazole) (0.75%) | 0.0074 | 15 | 204 |
| CFE-66/ CEx-66 | 76.55 | 12.00 | 2.50 | 7.50 | 0.50 | 0.20 | (3-amino-1,2,4-triazole-5-thiol) (0.75%) | 0.0074 | 18 | 688 |
| CFE-67/ CEx-67 | 76.55 | 12.00 | 2.50 | 7.50 | 0.50 | 0.20 | (1,2,4-triazole-3-carboxylic acid) (0.75%) | 0.0074 | 590 | 174 |

Table 15 shows that a relatively high amount of solubilized calcium cation (e.g., 7600 ppb) effectively reduced Al etch rate and therefore inhibited Al etching, while a relatively low amount of solubilized calcium cation (e.g., 195 ppb) did not reduce Al etch rate significantly. In addition, Table 15 shows that a composition containing 3-amino-1,2,4-triazole-5-carboxylic acid with a low amount of solubilized calcium did not effectively inhibit Al etch. Without wishing to be bound by theory, it is believed that a relatively high amount solubilized calcium cation could effectively inhibit Al etch regardless of the triazoles used. Further, without wishing to be bound by theory, it is believed that 3-amino-1,2,4-triazole-5-carboxylic acid can effectively solubilize calcium cation and therefore significantly increase the amount of the solubilized calcium in the stripping compositions described herein. As such, a combination of a suitable complexing agent (e.g., 3-amino-1,2,4-triazole-5-carboxylic acid) and a calcium salt (e.g., calcium oxalate) can significantly improve the Al etch inhibition of the stripping compositions described herein.

Examples 81-83

Effect of the Aluminum Inhibitor on Etch Rates of Other Metals

The effect of the inclusion of the optional Al inhibitor on the etch rate of other common materials exposed during stripping procedures was examined. The formulations employed are described in Table 16. Cu, Co, W and Ni films (10 minutes), Sn films (30 minutes and Al blanket films (6 minutes) were etched according to General Procedure 2 at 70° C. The etch rates of various materials when treated with the stripping compositions described in Table 16 are reported in Table 17.

TABLE 16

| Form. #/ Example # | DMSO | 3-methoxy-3-methyl butanol | TMAH | Water | Benzo-guanamine | Surfynol MD-20 | Al inhibitor |
|---|---|---|---|---|---|---|---|
| FE-29/Ex-81 | 77.30% | 12.00% | 2.50% | 7.50% | 0.50% | 0.20% | none |
| FE-37/Ex-82 | 76.12% | 12.00% | 2.50% | 7.68% | 0.50% | 0.20% | Phosphoric acid 1% |

TABLE 16-continued

| Form. #/ Example # | DMSO | 3-methoxy-3-methyl butanol | TMAH | Water | Benzo-guanamine | Surfynol MD-20 | Al inhibitor |
|---|---|---|---|---|---|---|---|
| FE-50/Ex-83 | 76.55% | 12.00% | 2.50% | 7.50% | 0.50% | 0.20% | 3-amino-1,2,4-triazole-5-carboxylic acid hydrate 0.75% + $Ca^{2+}$ 11 ppm |

TABLE 17

Etch Rates of Various Substrates When Treated with Stripping Compositions

| Example Number | Cu Etch Rate (Å/min) | W Etch Rate (Å/min) | Al Etch Rate (Å/min) | Ni Etch Rate (Å/min) | Co Etch Rate (Å/min) | $Si_3N_4$ Etch Rate (Å/min) | poly Si Etch Rate (Å/min) | Sn sheet resistance change (micro ohm/cm) |
|---|---|---|---|---|---|---|---|---|
| Ex-81 | 2 | 20 | 494 | 0.2 | 0.6 | 0.16 | 11.7 | 0.2432 |
| Ex-82 | 1 | 13 | 33 | 0 | 0.4 | 0 | 0.32 | 0.0134 |
| Ex-83 | 3 | 4 | 2.8 | 0 | 0 | 0.03 | 0 | 0.002 |

As shown in Table 17, stripping compositions of the disclosure comprising a water soluble polar aprotic organic solvent, a water soluble alcoholic solvent, a quaternary ammonium hydroxide, water, and a copper corrosion inhibitor showed good compatibility with the substrate materials tested except for Al, and are thus suitable for applications without exposed Al features. Table 17 also showed that addition of an aluminum corrosion inhibitor described herein surprisingly inhibited the Al etch rate with the additional benefit of lowering of the etch rate of most other substrate materials.

Formulation Examples 51 to 72

To further elaborate on the compositions of this disclosure, additional stripping formulations are described in Table 18.

TABLE 18

| Formulation Example Number | Solvent (%) | co-solvent (%) | Quat. Hydroxide (%) | Water (%) | Cu Etch Inhibitor (%) | Defoamer (%) | Al Etch Inhibitor (%) |
|---|---|---|---|---|---|---|---|
| FE-51 | NMP (76) | ethylene glycol mono n-butyl ether (12) | tetramethyl-ammonium hydroxide (2) | 7.5 | 6-methyl-1,3,5-triazine-2,4-diamine (0.5) | Surfynol MD-20 (0.2) | phosphoric acid (0.8%)/ DBU (1.2%) |
| FE-52 | NMP (76) | 3-methoxy-3-methyl-1-butanol (12) | choline (2.5) | 7.5 | 1,3,5-Triazine-2,4-diamine, 6-[2-(2-furanyl)ethyl]- (0.5) | Surfynol MD-20 (0.2) | 3-amino-1,2,4-triazole-5-carboxylic acid (1) |
| FE-53 | DMSO (85) | tetrahydro-furfuryl alcohol (5) | tetraethyl-ammonium hydroxide (2) | 6.3 | Benzo-guanamine (0.5) | Surfynol 104 (0.2) | phosphoric acid (1) |
| FE-54 | DMSO (35) | tetrahydro-furfuryl alcohol (36.8) | tetramethyl-ammonium hydroxide (0.5) | 25 | Benzo-guanamine | Troysol S366 (0.2) | 3-amino-1,2,4-triazole-5-carboxylic (0.5) acid (2) |
| FE-55 | DMSO (30) | ethylene glycol mono-n-butyl ether (55) | benzyl-trimethyl-ammonium hydroxide (1.5) | 2.5 | 6-methyl-1,3,5-triazine-2,4-diamine (5) | Troysol S366 (1) | guanidine (1.88)/ phosphoric acid (3.12) |
| FE-56 | NMP (40) | 3-methoxy-3-methyl-1-butanol (36.5) | tetramethyl-ammonium hydroxide (5) | 15 | 1,3,5-Triazine-2-propanoic acid, 4,6-diamino-, (1) | Surfynol MD-20 (0.5) | phosporic acid (0.9)/ benzyl-trimethyl-ammonium hydroxide (1.1) |

TABLE 18-continued

| Formulation Example Number | Solvent (%) | co-solvent (%) | Quat. Hydroxide (%) | Water (%) | Cu Etch Inhibitor (%) | Defoamer (%) | Al Etch Inhibitor (%) |
|---|---|---|---|---|---|---|---|
| FE-57 | Sulfolane (40) | 3-methoxy-3-methyl-1-butanol (37.5) | tetramethyl-ammonium hydroxide (2.5)/ benzyl-trimethyl-ammonium hydroxide (2.5) | 15 | Benzo-guanamine (1) | Troysol S366 (0.3)/ Surfynol MD-20 (0.2) | phosphoric acid (1) |
| FE-58 | Sulfolane (56) | ethylene glycol mono-n-butyl ether (25) | tetramethyl-ammonium hydroxide (3) | 13 | Benzo-guanamine (1)/6-methyl-1,3,5-triazine-2,4-diamine (0.5) | Surfynol MD-20 (0.5) | phosphoric acid (0.5)/ 3-amino-1,2,4-triazole-5-carboxylic acid (0.5) |
| FE-59 | DMSO (70) | ethylene glycol mono-n-butyl ether (15) | tetramethyl-ammonium hydroxide (3) | 10 | 6-methyl-1,3,5-triazine-2,4-diamine (0.7) | Surfynol MD-20 (0.3) | 5-amino-1H-1,2,3-Triazole-4-carboxylic acid (1) |
| FE-60 | 1,3-dimethyl-2-imidazolidinone (47.5) | 1-hexanol (20) | benzyl-trimethyl-ammonium hydroxide (10) | 12 | 6-methyl-1,3,5-triazine-2,4-diamine (5) | Surfynol MD-20 (0.5) | 2H-1,2,3-Triazole-4,5-dicarboxylic acid (5) |
| FE-61 | dimethyl sulfone (30) | ethylene glycol monomethyl ether (40) | tetramethyl-ammonium hydroxide (5.8) | 20 | 6-[(phenylthio)methyl]-,1,3,5-Triazine-2,4-diamine (1) | Troysol S366 (0.2) | 1H-1,2,4-Triazole-3,5-dicarboxylic acid, (3) |
| FE-62 | DMSO (60) | triethylene glycol monobutyl ether (24.3) | tetramethyl-ammonium hydroxide (4) | 10 | Benzo-guanamine (0.5) | Troysol S366 (0.2) | 4-(2-hydroxy-phenyl)-1H-1,2,3-Triazole-5-carboxylic acid (1) |
| FE-63 | NMP (50) | ethylene glycol monomethyl ether (40) | choline (3.5) | 3 | 6-methyl-1,3,5-triazine-2,4-diamine (1) | Surfynol MD-20 (0.5) | 5-mercapto-1H-1,2,3-Triazole-4-carboxylic acid (2) |
| FE-64 | DMSO (45) | 3-methoxy-3-methyl-1-butanol (21.5) | tetramethyl-ammonium hydroxide (5) | 15 | Benzo-guanamine (3) | Surfynol MD-20 (0.5) | 3-amino-1,2,4-triazole-5-carboxylic acid (10) |
| FE-65 | DMSO (30) | ethylene glycol mono-n-butyl ether (60) | tetramethyl-ammonium hydroxide (0.5) | 3.4 | 6-methyl-1,3,5-triazine-2,4-diamine (1) | Troysol S366 (0.1) | guanidine (1.88)/ phosphoric acid (3.12) |
| FE-66 | DMSO (85) | tetrahydro-furfuryl alcohol (7.5) | tetraethyl-ammonium hydroxide (2) | 4 | Benzo-guanamine (1.3) | Surfynol 104 (0.2) | none |
| FE-67 | 1,3-dimethyl-2-imidazolidinone (47.5) | 1-hexanol (22.5) | benzyl-trimethyl-ammonium hydroxide (10) | 12 | 6-methyl-1,3,5-triazine-2,4-diamine (5) | Surfynol MD-20 (3) | none |
| FE-68 | Sulfolane (40) | 3-methoxy-3-methyl-1-butanol (37.5) | tetramethyl-ammonium hydroxide (2.5)/ benzyl-trimethyl-ammonium hydroxide (2.5) | 16 | Benzo-guanamine (1) | Troysol S366 (0.3)/ Surfynol MD-20 (0.2) | none |
| FE-69 | dimethyl sulfone (30) | ethylene glycol monomethyl ether (43) | tetramethyl-ammonium hydroxide (5.8) | 20 | 6-[(phenylthio)methyl]-,1,3,5-Triazine-2,4-diamine (1) | Troysol S366 (0.2) | none |

TABLE 18-continued

| Formulation Example Number | Solvent (%) | co-solvent (%) | Quat. Hydroxide (%) | Water (%) | Cu Etch Inhibitor (%) | Defoamer (%) | Al Etch Inhibitor (%) |
|---|---|---|---|---|---|---|---|
| FE-70 | DMSO (55) | 3-methoxy-3-methyl-1-butanol (23.5) | tetramethyl-ammonium hydroxide (5) | 15 | Benzo-guanamine (0.5)/6-methyl-1,3,5-triazine-2,4-diamine (0.5) | Surfynol MD-20 (0.5) | none |
| FE-71 | dimethyl sulfone (30) | ethylene glycol monomethyl ether (49.4) | choline (0.1) | 10 | 6-methyl-1,3,5-triazine-2,4-diamine (10) | Troysol S366 (0.3)/ Surfynol MD-20 (0.2) | none |
| FE-72 | NMP (85) | ethylene glycol mono n-butyl ether (5) | tetramethyl-ammonium hydroxide (2) | 7.3 | 6-methyl-1,3,5-riazine-2,4-diamine (0.5) | Surfynol MD-20 (0.2) | none |

What is claimed is:

1. A photoresist stripping composition, comprising:
    1) at least one water soluble polar aprotic organic solvent in an amount of from about 30% to about 90% of the composition;
    2) at least one alcohol solvent;
    3) at least one quaternary ammonium hydroxide;
    4) water;
    5) at least one copper corrosion inhibitor selected from the group consisting of 6-substituted-2,4-diamino-1,3,5-triazines, the substituent at the 6-position being a substituted or unsubstituted aryl group; and
    6) optionally, at least one defoaming surfactant.

2. The composition of claim 1, wherein the at least one quaternary ammonium hydroxide comprises a compound of the formula $[NR_1R_2R_3R_4]^+OH$, in which each of $R_1$, $R_2$, $R_3$, and $R_4$, independently, is a linear, branched, or cyclic alkyl group optionally substituted by hydroxy, a substituted or unsubstituted phenyl group, or a substituted or unsubstituted benzyl group.

3. The composition of claim 2, wherein each of $R_1$, $R_2$, $R_3$, and $R_4$, independently, is a $C_1$-$C_4$ alkyl group, a hydroxyethyl group, a phenyl group, or a benzyl group.

4. The composition of claim 1, wherein the composition comprises from about 0.1% to about 10% of the at least one quaternary ammonium hydroxide.

5. The composition of claim 1, wherein the at least one copper corrosion inhibitor comprises 6-phenyl-2,4-diamino-1,3,5-triazine.

6. The composition of claim 1, wherein the composition comprises from about 0.1% to about 10% of the at least one copper corrosion inhibitor.

7. The composition of claim 1, wherein the at least one water soluble polar aprotic organic solvent comprises dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone, or a mixture thereof.

8. The composition of claim 1, wherein the at least one alcohol solvent comprises an alkane diol, a glycol, an alkoxyalcohol, a saturated aliphatic monohydric alcohol, an unsaturated non-aromatic monohydric alcohol, an alcohol containing a ring structure, or a mixture thereof.

9. The composition of claim 1, wherein the composition comprises from about 5% to about 60% of the at least one alcohol solvent.

10. The composition of claim 1, wherein the composition comprises from about 2.5% to about 25% of water.

11. The composition of claim 1, wherein the composition comprises from about 0.01% to about 3% of the at least one defoaming surfactant.

12. The composition of claim 1, further comprising at least one aluminum corrosion inhibitor.

13. A photoresist stripping composition, comprising:
    1) at least one water soluble polar aprotic organic solvent;
    2) at least one alcohol solvent;
    3) at least one quaternary ammonium hydroxide;
    4) water;
    5) at least one copper corrosion inhibitor selected from the group consisting of 6-substituted-2,4-diamino-1,3,5-triazines, the substituent at the 6-position being a substituted or unsubstituted aryl group;
    6) at least one aluminum corrosion inhibitor; and
    7) optionally, at least one defoaming surfactant;
    wherein the at least one aluminum corrosion inhibitor comprises a compound selected from the group consisting of phosphoric acids and salts of phosphoric acids.

14. The composition of claim 13, wherein the at least one aluminum corrosion inhibitor comprises monophosphoric acid, a polyphosphoric acid, a phosphoric anhydride, or a salt thereof.

15. A photoresist stripping composition, comprising:
    1) at least one water soluble polar aprotic organic solvent;
    2) at least one alcohol solvent;
    3) at least one quaternary ammonium hydroxide;
    4) water;
    5) at least one copper corrosion inhibitor selected from the group consisting of 6-substituted-2,4-diamino-1,3,5-triazines, the substituent at the 6-position being a substituted or unsubstituted aryl group;
    6) at least one aluminum corrosion inhibitor; and
    7) optionally, at least one defoaming surfactant;
    wherein the at least one aluminum corrosion inhibitor comprises first and second components, the first component comprising a Group II metal cation and the second component comprising an agent capable of solubilizing the Group II metal cation.

16. The composition of claim 15, wherein the first component comprises $Ca^{2+}$, $Mg^{2+}$, $Sr^{2+}$, or $Ba^{2+}$.

17. The composition of claim 15, wherein the agent is selected from the group consisting of 1,2,3-triazole carboxylic acid compounds substituted with a group that under basic conditions is an electron donating group, and 1,2,4-triazole carboxylic acid compounds substituted with a group that under basic conditions is an electron donating group.

18. The composition of claim 17, wherein the electron donating group is carboxyl, mercapto, hydroxyphenyl, amino, alkylamino, or dialkylamino.

19. The composition of claim 18, wherein the agent is 3-amino-1,2,4-triazole-5-carboxylic acid.

20. The composition of claim 12, wherein the composition comprises from about 0.1% to about 10% of the at least one aluminum corrosion inhibitor.

21. The composition of claim 1, wherein the composition has a pH of at least about 13.

22. A method, comprising:
    contacting a semiconductor substrate containing a photoresist or a photoresist residue with a composition of claim 1 to remove the photoresist or photoresist residue.

23. The method of claim 22, further comprising rinsing the semiconductor substrate with a rinse solvent after the contacting step.

24. The method of claim 23, further comprising drying the semiconductor substrate after the rinsing step.

25. The method of claim 22, wherein the method does not substantially remove Cu or Al in the semiconductor substrate.

26. A photoresist stripping composition, comprising:
    1) at least one water soluble polar aprotic organic solvent in an amount of from about 30% to about 90% of the composition;
    2) at least one alcohol solvent;
    3) at least one quaternary ammonium hydroxide;
    4) water;
    5) at least one copper corrosion inhibitor selected from the group consisting of 6-substituted-2,4-diamino-1,3,5-triazines, the substituent at the 6-position being a linear or branched, substituted or unsubstituted $C_2$-$C_{12}$ alkyl group, a substituted or unsubstituted $C_3$-$C_{12}$ cycloalkyl group, a substituted or unsubstituted aryl group, —$SCH_2R^{100}$, —$N(R^{100}R^{101})$ or imidyl, in which each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring; and
    6) optionally, at least one defoaming surfactant.

27. A photoresist stripping composition, comprising:
    1) at least one water soluble polar aprotic organic solvent in an amount of from about 30% to about 90% of the composition;
    2) at least one alcohol solvent;
    3) at least one quaternary ammonium hydroxide;
    4) water;
    5) at least one copper corrosion inhibitor selected from the group consisting of 6-substituted-2,4-diamino-1,3,5-triazines; and
    6) optionally, at least one defoaming surfactant;
    wherein the composition does not include an organic acid.

* * * * *